(12) United States Patent
Schneider

(10) Patent No.: US 11,912,614 B2
(45) Date of Patent: Feb. 27, 2024

(54) STRESS PROFILES OF HIGHLY FRANGIBLE GLASSES

(71) Applicant: CORNING INCORPORATED, Corning, NY (US)

(72) Inventor: Vitor Marino Schneider, Painted Post, NY (US)

(73) Assignee: CORNING INCORPORATED, Corning, NY (US)

( * ) Notice: Subject to any disclaimer, the term of this patent is extended or adjusted under 35 U.S.C. 154(b) by 572 days.

(21) Appl. No.: 17/084,766

(22) Filed: Oct. 30, 2020

(65) Prior Publication Data

US 2021/0130231 A1 May 6, 2021

Related U.S. Application Data

(60) Provisional application No. 62/930,260, filed on Nov. 4, 2019.

(51) Int. Cl.
| | |
|---|---|
| *B32B 15/04* | (2006.01) |
| *B32B 17/06* | (2006.01) |
| *C03C 21/00* | (2006.01) |
| *H05K 5/00* | (2006.01) |
| *H05K 5/03* | (2006.01) |
| *C03C 3/083* | (2006.01) |

(52) U.S. Cl.
CPC ............ *C03C 21/002* (2013.01); *C03C 3/083* (2013.01); *H05K 5/0017* (2013.01); *H05K 5/03* (2013.01)

(58) Field of Classification Search
CPC .................................................. C03C 21/002
USPC .................................................. 428/426, 410
See application file for complete search history.

(56) References Cited

U.S. PATENT DOCUMENTS

| | | | |
|---|---|---|---|
| 8,312,739 | B2 | 11/2012 | Lee et al. |
| 8,561,429 | B2 | 10/2013 | Allan et al. |
| 8,854,623 | B2 | 10/2014 | Fontaine et al. |

(Continued)

FOREIGN PATENT DOCUMENTS

| | | |
|---|---|---|
| WO | 2013/130653 A2 | 9/2013 |
| WO | 2016/057787 A2 | 4/2016 |
| WO | 2017/184803 A1 | 10/2017 |

OTHER PUBLICATIONS

Invitation to Pay Additional Fees of the International Searching Authority; PCT/US2020/057935; dated Mar. 9, 2021, 14 pages; European Patent Office.

(Continued)

*Primary Examiner* — Lauren R Colgan
(74) *Attorney, Agent, or Firm* — Travis B. Gasa

(57) ABSTRACT

Glass-based articles are frangible, comprising a peak central tension (CT) in a tensile region that is greater than: (E/68 GPa)*75 MPa*1 mm$^{0.5}$/$\sqrt{(t)}$, where E is the Young's modulus value of the glass-based substrate utilized to form the glass-based article. The stress profiles of the glass-based articles may comprise: a maximum compressive stress (CS$_{max}$) greater than or equal to 150 MPa; a depth of compression (DOC) that is greater than or equal to 0.21$t$; a peak central tension (CT) in a tensile region that is greater than or equal to 100 MPa to less than or equal to 220 MPa; and/or a negative curvature region, wherein a second derivative of stress as a function of depth is negative.

18 Claims, 10 Drawing Sheets

(56) References Cited

U.S. PATENT DOCUMENTS

| | | | |
|---|---|---|---|
| 11,453,612 B2* | 9/2022 | Roussev | C03C 3/097 |
| 2015/0368148 A1* | 12/2015 | Duffy | C03C 3/095 |
| | | | 428/220 |
| 2016/0102014 A1* | 4/2016 | Hu | C03C 23/007 |
| | | | 501/67 |
| 2017/0158556 A1* | 6/2017 | Dejneka | C03C 3/097 |
| 2017/0166478 A1* | 6/2017 | Gross | C03C 4/18 |
| 2017/0305786 A1* | 10/2017 | Roussev | C03C 21/002 |
| 2017/0355640 A1* | 12/2017 | Oram | C03C 21/002 |
| 2018/0265397 A1 | 9/2018 | Murayama et al. | |
| 2019/0161386 A1 | 5/2019 | Gross et al. | |
| 2019/0161390 A1 | 5/2019 | Gross et al. | |

OTHER PUBLICATIONS

Tandon et al., "Controlling the Fragmentation Behavior of Stressed Glass", Ceramic Materials Department, 2005, pp. 77-91.

* cited by examiner

STRESS PROFILES OF HIGHLY FRANGIBLE GLASSES

This application claims the benefit of priority of U.S. Provisional Application Ser. No. 62/930,260 filed on Nov. 4, 2019, the content of which is relied upon and incorporated herein by reference in its entirety.

BACKGROUND

Field

Embodiments of the disclosure generally relate to stress profiles of glass articles that are highly frangible, and more particularly to glass articles exhibiting improved fracture patterns; and to glass-based articles and consumer products made by these methods.

Technical Background

Glass-based articles have been widely applied as cover plates or windows for consumer electronic devices such as mobile phones, smart phones, tablets, video players, information terminal (IT) devices, laptop computers, navigation systems and the like.

As cover glass is directly bonded to a substrate like a touch-panel, display or other structures, when strengthened glass articles fracture, such articles may eject small fragments or particles from the free surface due to the stored energy created by a combination of surface compressive stresses and tensile stresses beneath the surfaces of the glass. As used herein, the term fracture includes cracking and/or the formation of cracks.

Chemical treatment is a strengthening method to impart a desired/engineered/improved stress profile having one or more of the following parameters: compressive stress (CS), depth of compression (DOC), and central tension (CT). Many glass-based articles, including those with engineered stress profiles, have a compressive stress that is highest or at a peak at the glass surface and reduces from a peak value moving away from the surface, and there is zero stress at some interior location of the glass article before the stress in the glass article becomes tensile. Chemical strengthening by ion exchange (IOX) of alkali-containing glass is a proven methodology in this field.

During ion exchange (IOX) strengthening, a glass-based substrate is brought into contact with a molten chemical salt so that an alkali metal of a relatively small ionic diameter in the glass-based substrate is ion-exchanged with an alkali metal of a relatively large ionic diameter in the chemical salt, therefore generating compressive stress on the surface to strengthen the glass.

There is an on-going need for glass articles that exhibit improved stress profiles in combination with a fragmentation behavior such that when the articles fracture, fewer fragments are ejected, which include fragments with less kinetic energy and momentum.

SUMMARY

Aspects of the disclosure pertain to glass-based articles, in particular glass-based articles that are frangible, and methods for their manufacture.

According to aspect (1), a glass-based article is provided. The glass-based article comprises: opposing first and second surfaces defining a thickness (t) in millimeters (mm); and a stress profile comprising: a maximum compressive stress ($CS_{max}$) greater than or equal to 150 MPa; a depth of compression (DOC) that is greater than or equal to 0.21t; and a peak central tension (CT) in a tensile region that is greater than: $(E/68 \text{ GPa})*75 \text{ MPa}*1 \text{ mm}^{0.5}/\sqrt{(t)}$, where E is a Young's modulus value of a glass-based substrate having the same composition and structure as a center of the glass-based article.

According to aspect (2), the glass-based article of aspect (1) is provided, wherein the CT is in the range of greater than or equal to 100 MPa and less than or equal to 220 MPa.

According to aspect (3), the glass-based article of any of aspects (1) to (2) is provided, wherein the t is in the range of greater than or equal to 0.02 millimeters and less than or equal to 2 millimeters.

According to aspect (4), a glass-based article is provided. The glass-based article comprises: a opposing first and second surfaces defining a thickness (t) that is in the range of greater than or equal to 0.02 millimeters to less than or equal to 2 millimeters; and a stress profile comprising: a maximum compressive stress ($CS_{max}$) greater than or equal to 150 MPa; a depth of compression (DOC) that is greater than or equal to 0.21t; and a normalized tensile energy ($WT_{norm}^{tens}$) stored in a tensile region of the glass-based article is greater than or equal to 60 $\text{MPa}^2 \cdot \text{m}^{0.5}$.

According to aspect (5), a glass-based article is provided. The glass-based article comprises: opposing first and second surfaces defining a thickness (t) that is in the range of greater than or equal to 0.4 millimeters to less than or equal to 0.8 millimeters; and a stress profile comprising: a maximum compressive stress ($CS_{max}$) greater than or equal to 150 MPa; a depth of compression (DOC) that is greater than or equal to 0.21t; and a peak central tension (CT) in a tensile region that is greater than or equal to 100 MPa to less than or equal to 220 MPa.

According to aspect (6), the glass-based article of any preceding aspect is provided, wherein the stress profile further comprises: a negative curvature region, wherein a second derivative of stress as a function of depth is negative.

According to aspect (7), the glass-based article of aspect (6) is provided, wherein a maximum absolute value of an average of the second derivative in the range of 0.05t to 0.18t is greater than or equal to 0.0001 $\text{MPa}/\mu\text{m}^2$.

According to aspect (8), the glass-based article of any preceding aspect is provided, wherein the peak central tension (CT) in the tensile region is less than or equal to 210 MPa.

According to aspect (9), the glass-based article of any preceding aspect is provided, wherein the peak central tension (CT) in the tensile region is less than or equal to 200 MPa.

According to aspect (10), the glass-based article of any preceding aspect is provided, wherein the peak central tension (CT) in the tensile region is less than or equal to 190 MPa.

According to aspect (11), the glass-based article of any preceding aspect is provided, wherein the peak central tension (CT) in the tensile region is less than or equal to 180 MPa.

According to aspect (12), the glass-based article of any preceding aspect is provided, wherein the stress profile further comprises: a spike region extending from the first surface to a knee; a tail region extending from the knee to a center of the glass-based article; wherein the spike region comprises the maximum compressive stress, the maximum compressive stress is greater than or equal to 500 MPa, and a compressive stress at the knee ($CS_k$) is greater than or equal to 100 MPa.

According to aspect (13), the glass-based article of any preceding aspect is provided, wherein the DOC is located at a depth of greater than or equal to 100 micrometers.

According to aspect (14), the glass-based article of any preceding aspect is provided, wherein the DOC is located at a depth of greater than or equal to 150 micrometers.

According to aspect (15), the glass-based article of any preceding aspect is provided, wherein the DOC is located at a depth of greater than or equal to 175 micrometers.

According to aspect (16), the glass-based article of any preceding aspect is provided, wherein the $CS_{max}$ is greater than or equal to 400 MPa.

According to aspect (17), the glass-based article of any preceding aspect is provided, wherein the $CS_{max}$ is greater than or equal 750 MPa.

According to aspect (18), the glass-based article of any preceding aspect is provided, wherein the $CS_{max}$ is greater than or equal 1000 MPa.

According to aspect (19), the glass-based article of any preceding aspect is provided, wherein upon breakage of the glass-based article and formation of fragments, a density of fragments is greater than or equal to 12.9 fragments/cm².

According to aspect (20), the glass-based article of any preceding aspect is provided, wherein upon breakage of the glass-based article and formation of fragments, an equivalent square size of the fragments is greater than or equal to 3 mm.

According to aspect (21), the glass-based article of any preceding aspect is provided, wherein an elastic energy ($W_{el}^{tens}$) stored in a tensile region is greater than or equal to 20 J/m² and/or less than or equal to 200 J/m².

According to aspect (22), the glass-based article of any preceding aspect is provided, wherein the elastic energy ($W_{el}^{tens}$) is greater than or equal to 75 J/m² and/or less than or equal to 175 J/m².

According to aspect (23), a glass-based article is provided. The glass-based article comprises: a lithium aluminosilicate composition; opposing first and second surfaces defining a thickness (t) that is in the range of greater than or equal to 0.4 millimeters to less than or equal to 0.8 millimeters; and a stress profile comprising: a maximum compressive stress ($CS_{max}$) greater than or equal to 500 MPa; a spike region extending from the first surface to a knee having a knee compressive stress ($CS_k$) of greater than or equal to 200 MPa; a tail region extending from the knee to a center of the glass-based article; a depth of compression (DOC) that is greater than or equal to 0.21t; and a peak central tension (CT) in a tensile region that is greater than or equal to 100 MPa to less than or equal to 220 MPa.

According to aspect (24), the glass-based article of aspect (23) is provided, wherein the stress profile further comprises: a negative curvature region, wherein a second derivative of stress as a function of depth is negative.

According to aspect (25), the glass-based article of aspect (24) is provided, wherein a maximum absolute value of an average of the second derivative in the range of 0.05t to 0.18t is greater than or equal to 0.0001 MPa/μm².

According to aspect (26), the glass-based article of any of aspects (23) to (25) is provided, wherein the DOC is located at a depth of greater than or equal to 100 micrometers.

According to aspect (27), the glass-based article of aspect (26) is provided, wherein the DOC is located at a depth of greater than or equal to 150 micrometers.

According to aspect (28), the glass-based article of aspect (27) is provided, wherein the DOC is located at a depth of greater than or equal to 175 micrometers.

According to aspect (29), the glass-based article of any of aspects (23) to (28) is provided, wherein the peak central tension (CT) in the tensile region is less than or equal to 210 MPa.

According to aspect (30), the glass-based article of aspect (29) is provided, wherein the peak central tension (CT) in the tensile region is less than or equal to 200 MPa.

According to aspect (31), the glass-based article of aspect (30) is provided, wherein the peak central tension (CT) in the tensile region is less than or equal to 190 MPa.

According to aspect (32), the glass-based article of aspect (31) is provided, wherein the peak central tension (CT) in the tensile region is less than or equal to 180 MPa.

According to aspect (33), the glass-based article of any of aspects (23) to (32) is provided, wherein upon breakage of the glass-based article and formation of fragments, a density of fragments is greater than or equal to 12.9 fragments/cm².

According to aspect (34), the glass-based article of any of aspects (23) to (33) is provided, wherein upon breakage of the glass-based article and formation of fragments, an equivalent square size of the fragments is greater than or equal to 3 mm.

According to aspect (35), the glass-based article of any of aspects (23) to (34) is provided, wherein an elastic energy ($W_{el}^{tens}$) stored in a tensile region is greater than or equal to 20 J/m² and/or less than or equal to 200 J/m².

According to aspect (36), the glass-based article of aspect (35) is provided, wherein the elastic energy ($W_{el}^{tens}$) is greater than or equal to 75 J/m² and/or less than or equal to 175 J/m².

According to aspect (37), a consumer electronic product is provided. The consumer electronic product comprises: a housing having a front surface, a back surface, and side surfaces; electrical components provided at least partially within the housing, the electrical components including at least a controller, a memory, and a display, the display being provided at or adjacent the front surface of the housing; and a cover disposed over the display; wherein at least a portion of at least one of the housing and the cover comprises the glass-based article of any preceding claim.

According to aspect (38), a method of manufacturing a glass-based article is provided. The method comprises: exposing a glass-based substrate having opposing first and second surfaces defining a substrate thickness (t) to an ion exchange salt bath for a duration of less than or equal to 16 hours at a bath temperature of greater than or equal to 400° C. and less than or equal to 500° C. such that the glass-based article comprises a peak central tension (CT) that is greater than or equal to 100 MPa and less than or equal to 220 MPa.

According to aspect (39), the method of aspect (38) is provided, wherein the stress profile further comprises: a negative curvature region, wherein a second derivative of stress as a function of depth is negative.

According to aspect (40), the method of aspect (39) is provided, wherein a maximum absolute value of an average of the second derivative in the range of 0.05t to 0.18t is greater than or equal to 0.0001 MPa/μm².

According to aspect (41), the method of any of aspects (38) to (40) is provided, wherein the glass-based article comprises a stress profile comprising: a maximum compressive stress ($CS_{max}$) greater than or equal to 150 MPa; and a depth of compression (DOC) that is greater than or equal to 0.21t.

According to aspect (42), the method of any of aspects (38) to (41) is provided, wherein the peak central tension (CT) in the tensile region is less than or equal to 210 MPa.

According to aspect (43), the method of aspect (42) is provided, wherein the peak central tension (CT) in the tensile region is less than or equal to 200 MPa.

According to aspect (44), the method of aspect (43) is provided, wherein the peak central tension (CT) in the tensile region is less than or equal to 190 MPa.

According to aspect (45), the method of aspect (44) is provided, wherein the peak central tension (CT) in the tensile region is less than or equal to 180 MPa.

According to aspect (46), the method of any of aspects (38) to (45) is provided, wherein the stress profile further comprises: a spike region extending from the first surface to a knee; a tail region extending from the knee to a center of the glass-based article; wherein the spike region comprises the maximum compressive stress, the maximum compressive stress is greater than or equal to 500 MPa, and a compressive stress at the knee ($CS_k$) is greater than or equal to 100 MPa.

According to aspect (47), the method of any of aspects (38) to (46) is provided, wherein an elastic energy ($W_{el}^{tens}$) stored in a tensile region is greater than or equal to 20 J/m² and/or less than or equal to 200 J/m².

According to aspect (48), the method of aspect (47) is provided, wherein the elastic energy ($W_{el}^{tens}$) is greater than or equal to 75 J/m² and/or less than or equal to 175 J/m².

According to aspect (49), a process for making a glass-based article based in part on mechanical modeling, the glass-based article comprising a peak central tension (CT) in a tensile region, is provided. The process comprises: exposing a glass-based substrate comprising opposing first and second surfaces defining a substrate thickness (t) in millimeters (mm) to an ion exchange treatment to form the glass-based article; generating a stress profile in the glass-based article comprising: a maximum compressive stress ($CS_{max}$) greater than or equal to 150 MPa; and a depth of compression (DOC) that is greater than or equal to 0.21t; wherein the peak central tension (CT) in the tensile region that is greater than: $(E/68 \text{ GPa})*75 \text{ MPa}*1 \text{ mm}^{0.5}/\sqrt{(t)}$, where E is Young's modulus value of the glass-based substrate.

According to aspect (50), the process of aspect (49) is provided, wherein the stress profile further comprises: a negative curvature region, wherein a second derivative of stress as a function of depth is negative.

According to aspect (51), the process of aspect (50) is provided, wherein a maximum absolute value of an average of the second derivative in the range of 0.05t to 0.18t is greater than or equal to 0.0001 MPa/µm².

According to aspect (52), the process of any of aspects (49) to (51) is provided, wherein upon breakage of the glass-based article and formation of fragments, an equivalent square size of the fragments is greater than or equal to 3 mm.

Additional features and advantages will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

The accompanying figures, which are incorporated in and constitute a part of this specification, illustrate several embodiments described below.

DETAILED DESCRIPTION

Figure 1:
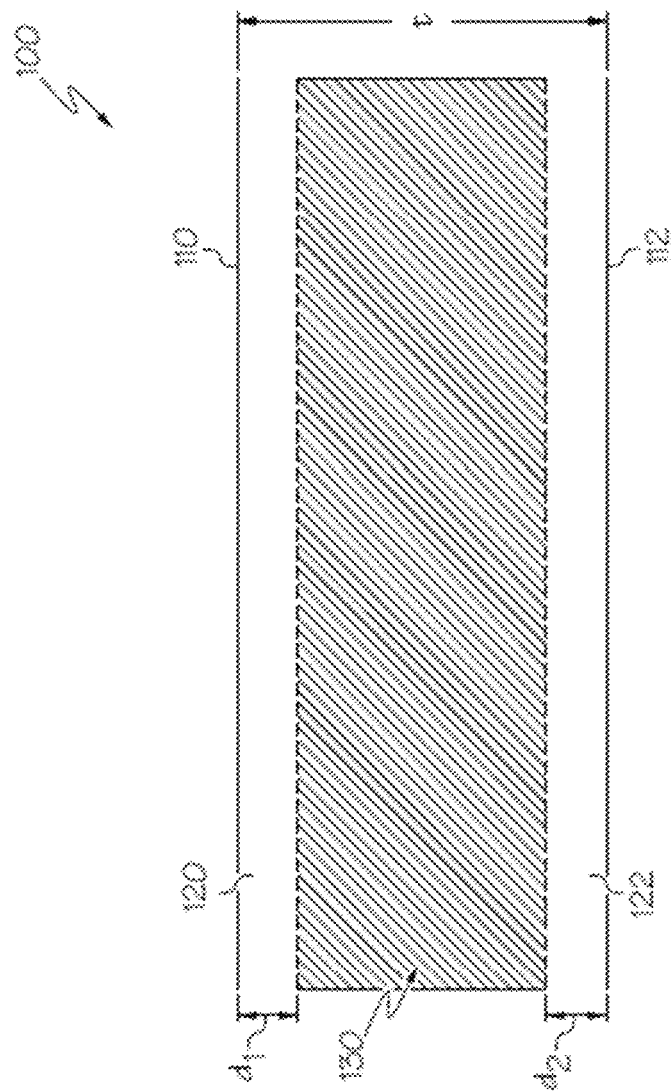
FIG. 1 schematically depicts a cross section of a glass having compressive stress layers on surfaces thereof according to embodiments disclosed and described herein.

Before describing several exemplary embodiments, it is to be understood that the disclosure is not limited to the details of construction or process steps set forth in the following disclosure. The disclosure provided herein is capable of other embodiments and of being practiced or being carried out in various ways.

Reference throughout this specification to "one embodiment," "certain embodiments," "various embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in various embodiments," "in one embodiment" or "in an embodiment" in various places throughout this specification are not necessarily referring to the same embodiment. Furthermore, the particular features, structures, materials, or characteristics may be combined in any suitable manner in one or more embodiments.

Definitions and Measurement Techniques

The terms "glass-based article" and "glass-based substrates" are used to include any object made wholly or partly of glass, including glass-ceramics (including an amorphous phase and a crystalline phase) and laminates. Laminated glass-based articles may include laminates of glass and non-glass materials and/or laminates of glass and crystalline materials. As generally utilized herein, glass-based substrates are subjected to ion exchange processes to form glass-based articles including a compressive stress profile. Exemplary glass-based substrates according to one or more embodiments can be selected from soda-lime silicate glass, alkali-alumino silicate glass, alkali-containing borosilicate glass, alkali-containing aluminoborosilicate glass, and alkali-containing glass-ceramics.

A "base composition" is a chemical make-up of a glass-based substrate prior to any ion exchange (IOX) treatment. That is, the base composition is undoped by any ions from IOX. A composition at the center of a glass-based article that has been IOX treated is least impacted by the ion exchange treatment, such that the composition and structure at the center of the glass-based article is the most similar to the composition and structure of the glass-based substrate. In one or more embodiments, a composition at the center of the glass-based article is substantially the same as the base composition of the glass-based substrate.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue. Thus, for example, a glass-based article that is "substantially free of MgO" is one in which MgO is not actively added or batched into the glass-based article, but may be present in very small amounts as a contaminant.

Unless otherwise specified, all compositions described herein are expressed in terms of mole percent (mol %) on an oxide basis.

A "stress profile" is a plot of stress with respect to position within a glass-based article. A compressive stress region, where the glass-based article is under compressive stress, extends from a first surface to a depth of compression (DOC) of the article. A central tension region extends from the DOC and includes the region where the glass-based article is under tensile stress.

As used herein, depth of compression (DOC) refers to the depth at which the stress within the glass-based article changes from compressive to tensile stress. At the DOC, the stress crosses from a positive (compressive) stress to a negative (tensile) stress and thus exhibits a stress value of zero. According to the convention normally used in mechanical arts, compression is expressed as a negative (<0) stress and tension is expressed as a positive (>0) stress. Throughout this description, however, compressive stress (CS) is expressed as a positive or absolute value—i.e., as recited herein, CS=|CS|. In addition, tensile stress is expressed herein as a negative (<0) stress. Central tension (CT) refers to tensile stress in a central region or a central tension region of the glass-based article. Maximum central tension (maximum CT or $CT_{max}$) refers to the maximum tensile stress in the central tension region. In some embodiments, maximum CT occurs in the central tension region nominally at 0.5·t, where t is the article thickness.

A "knee" of a stress profile is a depth of an article where the slope of the stress profile transitions from steep to gradual. The knee may refer to a transition area over a span of depths where the slope is changing. The knee stress $CS_k$ is defined as the value of compressive stress that the deeper portion of the CS profile extrapolates to at the depth of the spike ($DOL_{sp}$ or alternatively $DOL_K$).

A non-zero metal oxide concentration that varies from the first surface to a depth of layer (DOL) with respect to the metal oxide or that varies along at least a substantial portion of the article thickness (t) indicates that a stress has been generated in the article as a result of ion exchange. The variation in metal oxide concentration may be referred to herein as a metal oxide concentration gradient. The metal oxide that is non-zero in concentration and varies from the first surface to a DOL or along a portion of the thickness may be described as generating a stress in the glass-based article. The concentration gradient or variation of metal oxides is created by chemically strengthening a glass-based substrate in which a plurality of first metal ions in the glass-based substrate are exchanged with a plurality of second metal ions.

As used herein, the terms "depth of exchange", "depth of layer" (DOL), "chemical depth of layer", and "depth of chemical layer" may be used interchangeably, describing in general the depth at which ion exchange facilitated by an ion exchange process (IOX) takes place for a particular ion. DOL refers to the depth within a glass-based article (i.e., the distance from a surface of the glass-based article to its interior region) at which an ion of a metal oxide or alkali metal oxide (e.g., the metal ion or alkali metal ion) diffuses into the glass-based article where the concentration of the ion reaches a minimum value, as determined by Glow Discharge—Optical Emission Spectroscopy (GD-OES)). In some embodiments, the DOL is given as the depth of exchange of the slowest-diffusing or largest ion introduced by an ion exchange (IOX) process.

Unless otherwise specified, CT and CS are expressed herein in megaPascals (MPa), thickness is express in millimeters, and DOC, $DOL_{sp}$, and DOL are expressed in microns (micrometers).

Compressive stress (including surface/peak CS, $CS_{max}$) and $DOL_{sp}$ are measured by surface stress meter (FSM) using commercially available instruments such as the FSM-6000, manufactured by Orihara Industrial Co., Ltd. (Japan). Surface stress measurements rely upon the accurate measurement of the stress optical coefficient (SOC), which is related to the birefringence of the glass. SOC in turn is measured according to Procedure C (Glass Disc Method) described in ASTM standard C770-16, entitled "Standard Test Method for Measurement of Glass Stress-Optical Coefficient," the contents of which are incorporated herein by reference in their entirety.

The maximum central tension (CT) or peak tension (PT) and stress retention values are measured using a scattered light polariscope (SCALP) technique known in the art. The Refracted near-field (RNF) method or SCALP may be used to measure the stress profile and the depth of compression (DOC). When the RNF method is utilized to measure the stress profile, the maximum CT value provided by SCALP is utilized in the RNF method. In particular, the stress profile measured by RNF is force balanced and calibrated to the maximum CT value provided by a SCALP measurement. The RNF method is described in U.S. Pat. No. 8,854,623, entitled "Systems and methods for measuring a profile characteristic of a glass sample", which is incorporated herein by reference in its entirety. In particular, the RNF method includes placing the glass article adjacent to a reference block, generating a polarization-switched light beam that is switched between orthogonal polarizations at a rate of from 1 Hz to 50 Hz, measuring an amount of power in the polarization-switched light beam and generating a polarization-switched reference signal, wherein the measured amounts of power in each of the orthogonal polarizations are within 50% of each other. The method further includes transmitting the polarization-switched light beam through the glass sample and reference block for different depths into the glass sample, then relaying the transmitted polarization-switched light beam to a signal photodetector using a relay optical system, with the signal photodetector generating a polarization-switched detector signal. The method also includes dividing the detector signal by the reference signal to form a normalized detector signal and determining the profile characteristic of the glass sample from the normalized detector signal.

For determination of a second derivative of the stress profile, the following analysis is conducted. Any spike region of the stress profiled is excluded. A polymonial curve fitting is done over a region of interest. For example, a second derivative over a range of 10 micrometers to 400 micrometers or over a range of 40 micrometers to 144 micrometers could be informative of behavior of the stress profile. All ranges and subranges of the substrate or article thickness could be used. For the second derivatives determined herein, fourth order polymonials were used for the polynomial curve fitting. The first derivative of the fitted polynomial is computed using a forward finite difference: $df/dx=(f(x+deltax)-f(x))/(deltax)$. The second derivative is computed by taking again the forward finite difference of the calculated first derivative.

Fragmentation analysis was conducted as follows. Standard packaging tape was applied to the bottom surface of a glass-based article. The glass-based article was indented in its nominal center by a glass scribing pen that has a tip of tungsten carbide until the glass-based broke to form fragments that are attached to the tape. The fragments were measured by using the area of images generated by each fragment utilizing a calibrated VHX-5000 microscope from Keyence, USA.

To determine an equivalent square fragmentation size, for each fragment sized by the VHX-5000 microscope, a square root was taken to approximate a square that would result from the same area.

General Overview of Properties of Glass-Based Articles

Glass-based articles herein have stress profiles that are designed to increase probability of survival after dropping onto hard surfaces. The stress profiles include increased compressive stresses, for example, high peak compressive stress (CS) and high knee stress ($CS_k$), separately or in combination with other parameters. High depths of compression (DOC), e.g., greater than or equal to 0.21·t, separately or in combination with other parameters, are also achieved. Peak tension (PT), which may alternately be referred to as maximum central tension, of desired values representative of frangible glass-based articles are also obtained. In addition, the stress profiles may include stress relaxation as evidenced by a negative curvature region in a compressive stress layer, identified by having a negative second derivative, which contributes to the ability of the glass-based articles to survive dropping onto hard surfaces.

Frangible glass-based articles are desirable, as durability may increase with increasing levels of elastic energy stored in a tensile region of the glass-based articles, e.g., greater than or equal to 20 $J/m^2$ to less than or equal to 200 $J/m^2$. Higher degrees of stored elastic energy also may result in frangible behavior, and thus frangibility may be associated with increased durability. There is an ongoing effort to control fragmentation behavior of frangible glass-based articles, such that fragments have reduced kinetic energy and momentum.

For exchange of one ion into a glass-based substrate, for example exchange of potassium for sodium in a non-lithium glass, the stress profile is typically a complementary error function if the ions do not diffuse until the center of the sample, because the diffusion of the ion typically follows a complementary error function for such circumstances. If the ions diffuse until the center of sample (half-thickness) or past the center of the sample, the overall ion distribution resembles a parabola. Therefore, the stress profile will resemble a parabola in this case. For some glasses, upon exposure to longer durations of diffusion alone or in combination with higher temperature, regardless of whether the ions diffuse until the center or not and regardless of whether the stress profile looks like an complementary error function or a parabola, non-linear diffusion can occur, which results in stress relaxation and a corresponding a stress profile that is distorted relative to either a complementary error function or a parabola. In such a case, the complementary error function or the parabola is distorted to resemble an S-shaped stress profile. The glasses herein can have either a complementary error function, parabolic profile, or an S-shaped profile in combination with stresses inside the glass that are so intense to form a highly frangible article. DOC can be greater than or equal to 0.21·t, which for the S-shaped profiles is due at least in part to stress relaxation.

Without intending to be bound by any particular theory, it has been found that frangible glass-based articles having a combination of a modest central tension value and a negative curvature region in a compressive stress layer lead to desirable properties.

The size of fragments after breakage of frangible glass-based articles is dependent on CT and stored energy values. Glass-based articles presented herein are advantageous in that similar or better performance in drop tests can be achieved in glass-based articles with a lower CT and a DOC of 0.21t or more, which can lead to smaller fragment sizes. This can be advantageous for implementation of such glass-based articles in consumer products. It is expected that other glass-based substrates that also exhibit high stress relaxation will have the same trends in performance upon implementation of the stress profiles (in particular those with spikes) and parameters disclosed herein.

Disclosed herein are stress profiles of frangible glass-based articles. Methods for obtaining the frangible glass-based articles are amenable to both lithium-containing and non-lithium-containing glass-based substrates and to glass-based articles with and without a spike region of compressive stress. The glass-based articles having the stress profiles described herein exhibit improved drop performance. With reference to FIG. 1, the glass-based article 100 has a first region under compressive stress (e.g., first and second compressive stress layers 120, 122 in FIG. 1) extending from the surface to a depth of compression (DOC) and a second region (e.g., central region 130 in FIG. 1) under a tensile stress or central tension (CT) extending from the DOC into the central or interior region of the glass.

The compressive stress (CS) has a maximum or peak value, which typically occurs at the surface of the glass-based article (but such need not be the case as the peak may occur at a depth from the surface of the glass-based article), and the CS varies with distance d from the surface according to a function. Referring again to FIG. 1, the first compressive stress layer 120 extends from first surface 110 to a depth $d_1$ and a second compressive stress layer 122 extends from second surface 112 to a depth $d_2$. Together, these segments define a compression or CS of glass-based article 100. The compressive stress of both major surfaces 110, 112 is balanced by stored tension in the central region 130 of the glass.

Figure 2:
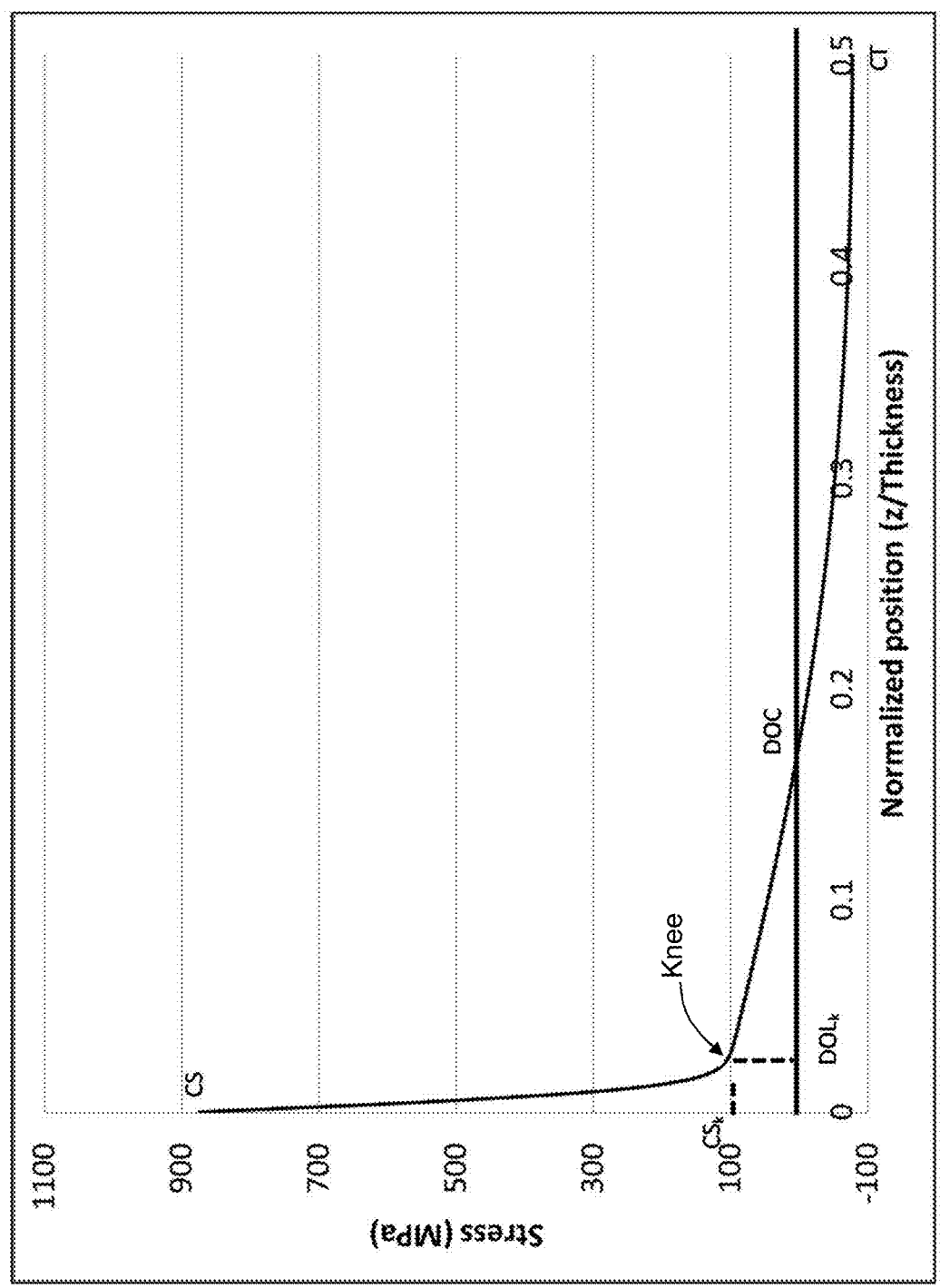
FIG. 2 shows a schematic representation of a stress profile including a knee stress.

FIG. 2 shows a schematic of a conventional stress profile in containing a spike region near the surface extending to a knee, and a tail region from the knee to deeper inside the glass towards the center. The stress profile comprises: a compressive stress (CS) at the surface, a depth of layer ($DOL_k$) of the spike region that is related to the diffusion depth of the ions near the spike, stress of the knee ($CS_k$), which is the stress at the asymptotic extrapolation of the spike and deep profile regions, a depth of compression (DOC), which is the location where the stress is first zero inside the glass-based article and changes sign from compression to tensile, and a central tension (CT) that is the stress at the center of the glass-based article. In FIG. 2, the convention is that compressive stress is positive and tensile is negative for illustration purposes.

In the glass-based articles, there is an alkali metal oxide having a non-zero concentration that varies from one or both of first and second surfaces to a depth of layer (DOL) with respect to the metal oxide. A stress profile is generated due to the non-zero concentration of the metal oxide(s) that varies from the first surface. The non-zero concentration may vary along a portion of the article thickness. In some embodiments, the concentration of the alkali metal oxide is non-zero and varies, both along a thickness range from about 0·t to about 0.3·t. In some embodiments, the concentration of the alkali metal oxide is non-zero and varies along a thickness range from about 0·t to about 0.35·t, from about 0·t to about 0.4·t, from about 0·t to about 0.45·t, from about 0·t to about 0.48·t, or from about 0·t to about 0.50·t. The variation in concentration may be continuous along the above-referenced thickness ranges. Variation in concentration may include a change in metal oxide concentration of about 0.2 mol % or more along a thickness segment of about 100 micrometers. The change in metal oxide concentration may be about 0.3 mol % or more, about 0.4 mol % or more, or about 0.5 mol % or more along a thickness segment of about 100 micrometers. This change may be measured by known methods in the art including microprobe.

In some embodiments, the variation in concentration may be continuous along thickness segments in the range from about 10 micrometers to about 30 micrometers. In some embodiments, the concentration of the alkali metal oxide decreases from the first surface to a value between the first surface and the second surface and increases from the value to the second surface.

The concentration of alkali metal oxide may include more than one metal oxide (e.g., a combination of $Na_2O$ and $K_2O$). In some embodiments, where two metal oxides are utilized and where the radius of the ions differ from one or another, the concentration of ions having a larger radius is greater than the concentration of ions having a smaller radius at shallow depths, while at deeper depths, the concentration of ions having a smaller radius is greater than the concentration of ions having larger radius.

In one or more embodiments, the alkali metal oxide concentration gradient extends through a substantial portion of the thickness t of the article. In some embodiments, the concentration of the metal oxide may be about 0.5 mol % or greater (e.g., about 1 mol % or greater) along the entire thickness of the first and/or second section, and is greatest at a first surface and/or a second surface 0·t and decreases substantially constantly to a value between the first and second surfaces. At that value, the concentration of the metal oxide is the least along the entire thickness t; however the concentration is also non-zero at that point. In other words, the non-zero concentration of that particular metal oxide extends along a substantial portion of the thickness t (as described herein) or the entire thickness t. The total concentration of the particular metal oxide in the glass-based article may be in the range from about 1 mol % to about 20 mol %.

The concentration of the alkali metal oxide may be determined from a baseline amount of the metal oxide in the glass-based substrate ion exchanged to form the glass-based article. Stated differently, the change in the concentration of the alkali metal oxide as a result of the ion exchange treatment may be determined, and the discussion of the concentration of the alkali metal oxide above applies equally to such a change in metal oxide concentration.

In an aspect, a glass-based article comprises: a glass-based substrate comprising opposing first and second surfaces defining a substrate thickness (t) in millimeters (mm); and a stress profile comprising: a maximum compressive stress ($CS_{max}$) greater than or equal to 150 MPa; a depth of compression (DOC) that is greater than or equal to 0.21t; and a peak central tension (CT) in a tensile region that is greater than: $(E/68\ GPa)*75\ MPa*1\ mm^{0.5}/\sqrt{(t)}$, where E is Young's modulus value of the glass-based substrate.

Another aspect is a glass-based article comprising: a glass-based substrate comprising opposing first and second surfaces defining a substrate thickness (t) that is in the range of greater than or equal to 0.02 millimeters and less than or equal to 2 millimeters; and a stress profile comprising: a maximum compressive stress ($CS_{max}$) greater than or equal to 150 MPa; a depth of compression (DOC) that is greater than or equal to 0.21t; and a normalized tensile energy ($WT_{norm}^{tens}$) stored in a tensile region of the glass-based article is greater than or equal to 60 $MPa^2 \cdot m^{0.5}$.

Another aspect is a glass-based article comprising: a glass-based substrate comprising opposing first and second surfaces defining a substrate thickness (t) that is in the range of greater than or equal to 0.4 millimeters and less than or equal to 0.8 millimeters; and a stress profile comprising: a maximum compressive stress ($CS_{max}$) greater than or equal to 150 MPa; a depth of compression (DOC) that is greater than or equal to 0.21t; and a peak central tension (CT) in a tensile region that is greater than or equal to 100 MPa to less than or equal to 220 MPa.

In an aspect, a glass-based article comprises: a glass-based substrate comprising a lithium aluminosilicate composition and opposing first and second surfaces defining a substrate thickness (t) that is in the range of greater than or equal to 0.4 millimeters and less than or equal to 0.8 millimeters; and a stress profile comprising: a maximum compressive stress ($CS_{max}$) greater than or equal to 500 MPa; a spike region extending from the first surface to a knee having a knee compressive stress ($CS_k$) of greater than or equal to 200 MPa; a tail region extending from the knee to a center of the glass-based article; a depth of compression (DOC) that is greater than or equal to 0.21t; and a peak central tension (CT) in a tensile region that is greater than or equal to 100 MPa to less than or equal to 220 MPa.

In an embodiment of any aspect, peak central tension CT may be in the range of greater than or equal to 100 MPa and less than or equal to 220 MPa, and all values and subranges therebetween, including greater than or equal to 110 MPa, greater than or equal to 120 MPa, greater than or equal to 130 MPa, greater than or equal to 140 MPa, greater than or equal to 140 MPa, greater than or equal to 160 MPa, greater than or equal to 170 MPa, greater than or equal to 180 MPa, or greater than or equal to 190 MPa, greater than or equal to 210 MPa, and/or less than or equal to 200 MPa, less than or equal to 190 MPa, less than or equal to 180 MPa.

In one or more embodiments of any aspect, the stress profile of the glass-based article comprises: a negative curvature region, wherein a second derivative of stress as a function of depth is negative. A maximum absolute value of an average of the second derivative in the range of 0.05t to 0.18t may be is greater than or equal to 0.0001 MPa/μm$^2$, including greater than or equal to 0.001 MPa/μm$^2$, greater than or equal to 0.0025 MPa/μm$^2$, greater than or equal to 0.005 MPa/μm$^2$, greater than or equal to 0.01 MPa/μm$^2$, greater than or equal to 0.015 MPa/μm$^2$, and/or less than or equal to 0.2 MPa/μm$^2$.

In one or more embodiments of any aspect, the stress profile of the glass-based article further comprises: a spike region extending from the first surface to a knee; a tail region extending from the knee to a center of the glass-based article; wherein the spike region comprises the maximum compressive stress that is greater than or equal to 500 MPa, and a compressive stress at the knee ($CS_k$) of greater than or equal to 100 MPa.

In one or more embodiments of any aspect, the glass-based article comprises a peak compressive stress (CS or $CS_{max}$) that is greater than or equal to 150 MPa, greater than or equal to 200 MPa, greater than or equal to 250 MPa, greater than or equal to 300 MPa, greater than or equal to 350 MPa, greater than or equal to 400 MPa, greater than or equal to 450 MPa, greater than or equal to 500 MPa, greater than or equal to 550 MPa, greater than or equal to 600 MPa, greater than or equal to 750 MPa, greater than or equal to 800 MPa, greater than or equal to 850 MPa, greater than or equal to 900 MPa, greater than or equal to 950 MPa, greater than or equal to 1000 MPa, greater than or equal to 1050 MPa, and/or less than or equal to 1500 MPa, and including all values and subranges therebetween.

In one or more embodiments of any aspect, the glass-based article comprises a depth of compression (DOC) that is greater than or equal to 0.21t, greater than or equal 0.215t, greater than or equal 0.22t, greater than or equal 0.225t, greater than or equal 0.23t, greater than or equal 0.235t, greater than or equal 0.24t, greater than or equal 0.245t, and/or less than or equal to 0.30t, less than or equal to 0.29t, less than or equal to 0.28t, less than or equal to 0.27t, less than or equal to 0.26t, less than or equal to 0.25t, including all values and subranges therebetween.

In one or more embodiments of any aspect, the glass-based article comprises a depth of compression (DOC) at a depth of greater than or equal to 100 micrometers, greater than or equal to 150 micrometers, greater than or equal to 175 micrometers, including all values and subranges therebetween.

In one or more embodiments of any aspect, the glass-based article comprises an elastic energy ($W_{el}^{tens}$) stored in a tensile region that is greater than or equal to 20 J/m$^2$ and/or less than or equal to 200 J/m$^2$; including being greater than or equal to 75 J/m$^2$ and/or less than or equal to 175 J/m$^2$; greater than or equal to 30 J/m$^2$, greater than or equal to 40 J/m$^2$, greater than or equal to 50 J/m$^2$, greater than or equal to 60 J/m$^2$, greater than or equal to 70 J/m$^2$, greater than or equal to 80 J/m$^2$, greater than or equal to 90 J/m$^2$, greater than or equal to 100 J/m$^2$, greater than or equal to 110 J/m$^2$, or greater than or equal to 115 J/m$^2$.

In one or more embodiments of any aspect, the glass-based article comprises a normalized tensile energy ($WT_{norm}^{tens}$) stored in a tensile region of the glass-based article that is greater than or equal to 60 MPa$^2$m$^{0.5}$, including greater than or equal to 120 MPa$^2$m$^{0.5}$; greater than or equal to 180 MPa$^2$m$^{0.5}$; greater than or equal to 240 MPa$^2$m$^{0.5}$; greater than or equal to 300 MPa$^2$m$^{0.5}$; and/or less than or equal to 1000 MPa$^2$m$^{0.5}$.

In one or more embodiments of any aspect, upon breakage of the glass-based article and formation of fragments, a density of fragments is greater than or equal to 12.9 fragments/cm$^2$, such as greater than or equal to 20 fragments/cm$^2$, greater than or equal to 200 fragments/cm$^2$, or more.

In one or more embodiments of any aspect, upon breakage of the glass-based article and formation of fragments, an equivalent size of the fragments is greater than or equal to 3 mm.

In one or more embodiments of any aspect, the glass-based article comprises a compressive stress at the knee ($CS_k$) of greater than or equal to 100 MPa, such as greater than or equal to 150 MPa, greater than or equal to 200 MPa, greater than or equal to 220 MPa, or more.

In one or more embodiments of any aspect, the glass-based article comprises an article thickness ($t_A$) in the range of 0.02 mm to 2 mm, and all values and subranges therebetween; and/or $t_A$ may be including greater than or equal to 100 micrometers to less than or equal to 1.75 millimeters, greater than or equal to 200 micrometers to less than or equal to 1.5 millimeters, greater than or equal to 300 micrometers to less than or equal to 1.25 millimeters, greater than or equal to 350 micrometers to less than or equal to 1 millimeters, greater than or equal to 400 micrometers to less than or equal to 800 micrometers, and all values and subranges therebetween.

Glass-Based Substrates

Examples of glass-based substrates that may be used to form the glass-based articles include, but are not limited to, soda-lime silicate glass, an alkali aluminosilicate glass, an alkali-containing borosilicate glass, an alkali aluminoborosilicate glass, an alkali-containing lithium aluminosilicate glass, or an alkali-containing phosphate glass. The glass-based substrates have compositions that may be characterized as ion exchangeable. As used herein, "ion exchangeable" means that a substrate comprising the composition is capable of exchanging cations located at or near the surface of the substrate with cations of the same valence that are either larger or smaller in size.

Thickness of the substrate (t) may be in the range of greater than or equal to 20 micrometers to less than or equal to 2 millimeters, including greater than or equal to 100 micrometers to less than or equal to 1.75 millimeters, greater than or equal to 200 micrometers to less than or equal to 1.5 millimeters, greater than or equal to 300 micrometers to less than or equal to 1.25 millimeters, greater than or equal to 350 micrometers to less than or equal to 1 millimeters, greater than or equal to 400 micrometers to less than or equal to 800 micrometers, and all values and subranges therebetween.

Exemplary substrates may comprise but are not limited to: a soda lime silicate glass, alkali aluminosilicate glass, alkali-containing borosilicate glass, alkali-containing aluminoborosilicate glass, and alkali-containing glass-ceramics. In one or more embodiments, the glass-based substrate has an alkali metal oxide content of 2 mole % or greater.

In embodiments, the glass-based substrates may be formed from any composition capable of forming the stress profiles. In some embodiments, the glass-based substrates may be formed from the glass compositions described in U.S. Patent Application Publication No. 2019/0161390 A1 titled "Glasses with Low Excess Modifier Content," the entirety of which is incorporated herein by reference. In some embodiments, the glass articles may be formed from the glass compositions described in U.S. Patent Application Publication No. 2019/0161386 A1 titled "Ion-Exchangeable Mixed Alkali Aluminosilicate Glasses," the entirety of which is incorporated herein by reference.

The glass-based substrates may be characterized by the manner in which it may be formed. For instance, the glass-based substrates may be characterized as float-formable (i.e., formed by a float process), down-drawable and, in particular, fusion-formable or slot-drawable (i.e., formed by a down draw process such as a fusion draw process or a slot draw process).

Some embodiments of the glass-based substrates described herein may be formed by a down-draw process. Down-draw processes produce glass-based substrates having a uniform thickness that possess relatively pristine surfaces. Because the average flexural strength of the glass article is controlled by the amount and size of surface flaws, a pristine surface that has had minimal contact has a higher initial strength. In addition, down drawn glass articles have a very flat, smooth surface that can be used in its final application without costly grinding and polishing.

Some embodiments of the glass-based substrates may be described as fusion-formable (i.e., formable using a fusion draw process). The fusion process uses a drawing tank that has a channel for accepting molten glass raw material. The channel has weirs that are open at the top along the length of the channel on both sides of the channel. When the channel fills with molten material, the molten glass overflows the weirs. Due to gravity, the molten glass flows down the outside surfaces of the drawing tank as two flowing glass films. These outside surfaces of the drawing tank extend down and inwardly so that they join at an edge below the drawing tank. The two flowing glass films join at this edge to fuse and form a single flowing glass article. The fusion draw method offers the advantage that, because the two glass films flowing over the channel fuse together, neither of the outside surfaces of the resulting glass article comes in contact with any part of the apparatus. Thus, the surface properties of the fusion drawn glass article are not affected by such contact.

Some embodiments of the glass-based substrates described herein may be formed by a slot draw process. The slot draw process is distinct from the fusion draw method. In slot draw processes, the molten raw material glass is provided to a drawing tank. The bottom of the drawing tank has an open slot with a nozzle that extends the length of the slot. The molten glass flows through the slot/nozzle and is drawn downward as a continuous glass article and into an annealing region.

In one or more embodiments, the glass-based substrates described herein may exhibit an amorphous microstructure and may be substantially free of crystals or crystallites.

In other words, the glass-base substrates articles exclude glass-ceramic materials in some embodiments. In other embodiments, the glass-based substrate may include glass-ceramic materials.

Ion Exchange (IOX) Treatment

Chemical strengthening of glass substrates having base compositions is done by placing the ion-exchangeable glass-based substrates in a molten bath containing cations (e.g., K+, Na+, Ag+, etc) that diffuse into the glass-based substrate while the smaller alkali ions (e.g., Na+, Li+) of the glass-based substrate diffuse out into the molten bath. The replacement of the smaller cations by larger ones creates compressive stresses near the top surface of the produced glass-based article. Tensile stresses are generated in the interior of the glass-based article to balance the near-surface compressive stresses.

With respect to ion exchange processes, they may independently be a thermal-diffusion process or an electro-diffusion process. Non-limiting examples of ion exchange processes in which glass-based substrate is immersed in multiple ion exchange baths, with washing and/or annealing steps between immersions, are described in U.S. Pat. No. 8,561,429, by Douglas C. Allan et al., issued on Oct. 22, 2013, entitled "Glass with Compressive Surface for Consumer Applications," in which glass-based substrates are strengthened by immersion in multiple, successive, ion exchange treatments in salt baths of different concentrations; and U.S. Pat. No. 8,312,739, by Christopher M. Lee et al., issued on Nov. 20, 2012, and entitled "Dual Stage Ion Exchange for Chemical Strengthening of Glass," in which glass-based substrates are strengthened by ion exchange in a first bath diluted with an effluent ion, followed by immersion in a second bath having a smaller concentration of the effluent ion than the first bath. The contents of U.S. Pat. Nos. 8,561,429 and 8,312,739 are incorporated herein by reference in their entireties.

After an ion exchange process is performed, it should be understood that a composition at the surface of a glass-based article may be different than the composition of the as-formed glass-based substrate (i.e., the glass-based substrate before it undergoes an ion exchange process). This results from one type of alkali metal ion in the as-formed glass-based substrate, such as, for example $Li^+$ or $Na^+$, being replaced with larger alkali metal ions, such as, for example $Na^+$ or $K^+$, respectively. However, the composition at or near the center of the depth of the glass-based article will, in embodiments, still have the composition of the as-formed glass-based substrate.

Embodiments herein are advantageous in that frangible glass-based articles are formed having desirable fragmentation behavior. Methods herein are amenable to single step ion exchange (SIOX) and multi-step ion exchange, for example, dual step ion exchange (DIOX) alone or in combination with both lithium-containing and non-lithium-containing glass-based substrates.

In an aspect, a method of manufacturing a glass-based article comprises: exposing a glass-based substrate having opposing first and second surfaces defining a substrate thickness (t) to an ion exchange salt bath for a duration of less than or equal to 16 hours. The glass-based article may comprise a peak central tension (CT) that is greater than or equal to 100 MPa and less than or equal to 220 MPa, and all values and subranges therebetween.

In an embodiment of any aspect, a bath temperature of the ion exchange salt bath may be greater than or equal to 400° C. and less than or equal to 500° C., and all values and subranges therebetween, including the temperature being greater than or equal to 400° C., greater than or equal to 405° C., greater than or equal to 410° C., greater than or equal to 415° C., greater than or equal to 420° C., greater than or equal to 425° C., greater than or equal to 430° C., greater than or equal to 435° C., greater than or equal to 440° C., greater than or equal to 445° C., greater than or equal to 450° C., greater than or equal to 455° C., greater than or equal to 460° C., greater than or equal to 465° C., greater than or equal to 470° C., greater than or equal to 475° C., greater than or equal to 480° C., greater than or equal to 485° C., greater than or equal to 490° C., greater than or equal to 495° C., and/or the temperature being less than or equal to 500° C., less than or equal to 490° C., less than or equal to 480°

C., less than or equal to 470° C., less than or equal to 460° C., or less than or equal to 450° C.

In an embodiment of any aspect, the stress profile further comprises: a negative curvature region, wherein a second derivative of stress as a function of depth is negative. In an embodiment, a maximum absolute value of the second derivative in the range of 0.05t to 0.18t is greater than or equal to 0.0001 MPa/μm².

In an embodiment of any aspect, the glass-based article comprises a stress profile comprising: a maximum compressive stress ($CS_{max}$) greater than or equal to 150 MPa; and a depth of compression (DOC) that is greater than or equal to 0.21t. In an embodiment, the peak central tension (CT) in the tensile region is less than or equal to 210 MPa, such as less than or equal to 200 MPa, less than or equal to 190 MPa, or less than or equal to 180 MPa.

In an embodiment of any aspect, wherein the stress profile further comprises: a spike region extending from the first surface to a knee; and a tail region extending from the knee to a center of the glass-based article. The spike region comprises the maximum compressive stress that is greater than or equal to 500 MPa, and a compressive stress at the knee ($CS_k$) of greater than or equal to 100 MPa.

In an embodiment, an elastic energy ($W_{el}^{tens}$) stored in a tensile region is greater than or equal to 20 J/m² and/or less than or equal to 200 J/m², and all values and subranges therein, including greater than or equal to 75 J/m² and/or less than or equal to 175 J/m²; greater than or equal to 30 J/m², greater than or equal to 40 J/m², greater than or equal to 50 J/m², greater than or equal to 60 J/m², greater than or equal to 70 J/m², greater than or equal to 80 J/m², greater than or equal to 90 J/m², greater than or equal to 100 J/m², greater than or equal to 110 J/m², or greater than or equal to 115 J/m².

Energy Parameters

Glass-based articles described herein are frangible. Upon breakage, which includes bifurcations and breakage of the part into 3 or more parts, based on fundamental mechanics, energy release is proportional to integration of the stress squared or the tensile energy in a tensile region of the stress profile. Based on the disclosure herein, with respect to central tension (CT), stress profiles where the sample becomes frangible typically satisfy:

$$CT > (E/68 \text{ GPa})*75 \text{ MPa}*1 \text{ mm}^{0.5}/\sqrt{t} \quad (1),$$

where t is the thickness in mm of the glass-based article, and E is the Young's modulus in GPa of the glass-based substrate utilized to form the glass-based substrate. Equation (1) gives the approximate CT (in MPa) regime where the glass-based article is frangible, which can be scaled by Young's modulus and thickness. The glass-based articles described herein are in the range where the glass is frangible and in many cases well above the limit specified in Equation (1). For glass-based substrates with a higher Young's modulus, the CT limit where the glass-based article becomes frangible increases as the energy stored in the tensile region is reduced. For higher thicknesses also, the maximum CT allowed by the diffusion of a single ion in a SIOX process is reduced.

The elastic energy stored by the stress profile is calculated according to the equation:

$$W_{el} = \frac{(1-v)}{E} \int \sigma^2 dx, \quad (2)$$

where v is the Poisson ratio, E is Young's modulus, and σ is the stress. For an exemplary glass of Composition A defined as 57.43 mol % $SiO_2$, 16.10 mol % $Al_2O_3$, 17.05 mol % $Na_2O$, 2.81 mol % MgO, 0.003 mol % $TiO_2$, 6.54 mol % $P_2O_5$, and 0.07 mol % $SnO_2$, the Poisson ratio (v) is 0.22, and the Young's modulus (E) is about 68 GPa.

Elastic energy (per unit area of glass) is for a symmetric profile is:

$$W_{el}^{comp} = 2\frac{1-v}{E} \int_0^{DOC} \sigma^2 dx. \quad (3)$$

Elastic energy in the tension region from the compression depth to the center of the glass substrate is:

$$W_{el}^{tens} = 2\frac{1-v}{E} \int_{DOC}^{0.5t} \sigma^2 dx. \quad (4)$$

A factor of 2 is used herein to take into account the symmetry of the stress profile so integration only in the first half is needed in this case. The total elastic energy stored in the substrate is the sum of the elastic energy of the single compression region and the half tension region:

$$W_{el}^{tot} = (W_{el}^{comp} + W_{el}^{tens}) \quad (5).$$

Units for the quantities in the above equations are as follows.

For stress:
[σ]=MPa≡$10^6$ N/m².
For depth:
[x]=μm=$10^{-6}$m.
For elastic energy (per unit substrate area):

$$[W_{el}] = \text{MPa}^{-1} * \text{MPa} * 10^6 \frac{\text{N}}{\text{m}^2} * 10^{-6}\text{m} \equiv \frac{\text{N} * \text{m}}{\text{m}^2} \equiv \frac{J}{\text{m}^2} \equiv \frac{\mu J}{\text{mm}^2}.$$

Another metric is elastic energy per unit glass-based article area per square root of the unit thickness of the glass-based article, with units of: J/m²m$^{0.5}$, which can serve as a more universal parameter because it is independent of the thickness and is valid for thickness ranges of both less than or equal to 50 μm and greater than or equal to 2000 μm and all values and subranges therebetween.

In another aspect, a frangibility criterion may be introduced in the form of a normalized total compressive and tensile energy defined as:

$$W_{norm}^{tot} = \frac{W_{el}^{tot}}{\left(\frac{1-v}{E}\right)} = \int_0^{Thickness} \sigma^2, \quad (6)$$

$$W_{norm}^{comp} = 2\frac{W_{el}^{comp}}{\left(\frac{1-v}{E}\right)} = \int_0^{DOC} \sigma^2, \quad (7)$$

$$W_{norm}^{tens} = 2\frac{W_{el}^{tens}}{\left(\frac{1-v}{E}\right)} = \int_{DOC}^{0.5T} \sigma^2. \quad (8)$$

The use of a normalized energy has the advantage of being represented easily in units of MPa² m, and is independent of the material parameters.

Finally, the normalized energy may be further renormalized by the square root of the thickness as a WT parameter, $$WT_{norm}^{tot} = W_{norm}^{tot}/\sqrt{T} \quad (9),$$

$$WT_{norm}^{comp} = W_{norm}^{comp}/\sqrt{T} \quad (10),$$

$$WT_{norm}^{tens} = W_{norm}^{tens}/\sqrt{T} \quad (11)$$

These WT parameters have a dimension of $MPa^2m^{0.5}$ and have embedded therein a variable thickness component.

According to an aspect, a process for making a glass-based article based in part on mechanical modeling, the glass-based article comprising a peak central tension (CT) in a tensile region comprises: exposing a glass-based substrate comprising opposing first and second surfaces defining a substrate thickness (t) in millimeters (mm) to an ion exchange treatment to form the glass-based article; generating a stress profile in the glass-based article comprising: a maximum compressive stress ($CS_{max}$) greater than or equal to 150 MPa; and a depth of compression (DOC) that is greater than or equal to 0.21t; wherein the peak central tension (CT) in the tensile region that is greater than:

$$(E/68 \text{ GPa})*75 \text{ MPa}*1 \text{ mm}^{0.5}/\sqrt{(t)},$$

where E is Young's modulus value of the glass-based substrate.

The stress profile may further comprise: a negative curvature region, wherein a second derivative of stress as a function of depth is negative. A maximum absolute value of an average of the second derivative in the range of 0.05t to 0.18t may be greater than or equal to 0.0001 $MPa/\mu m^2$. In an embodiment, upon breakage of the glass-based article and formation of fragments, an equivalent square size of the fragments is greater than or equal to 3 mm.

End Products

Figure 3A:
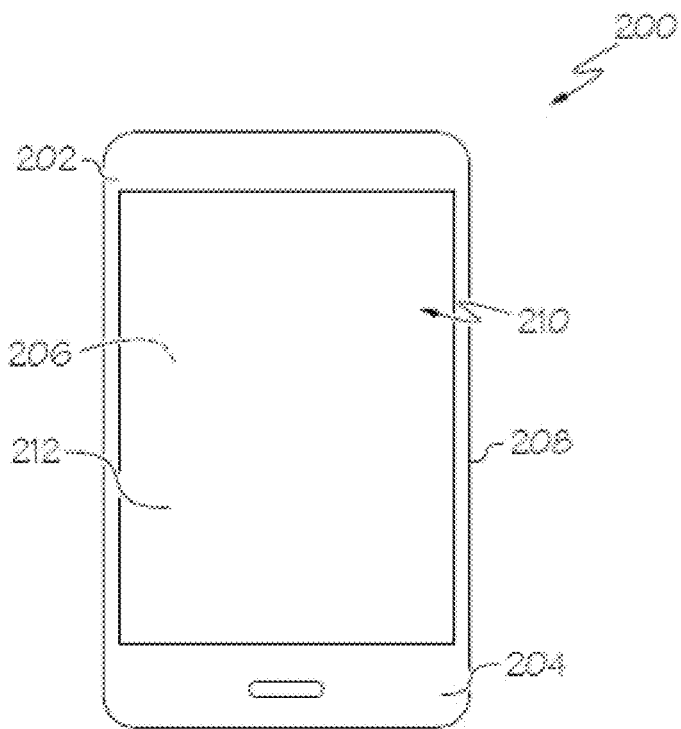
FIG. 3A is a plan view of an exemplary electronic device incorporating any of the glass articles disclosed herein.
Figure 3B:
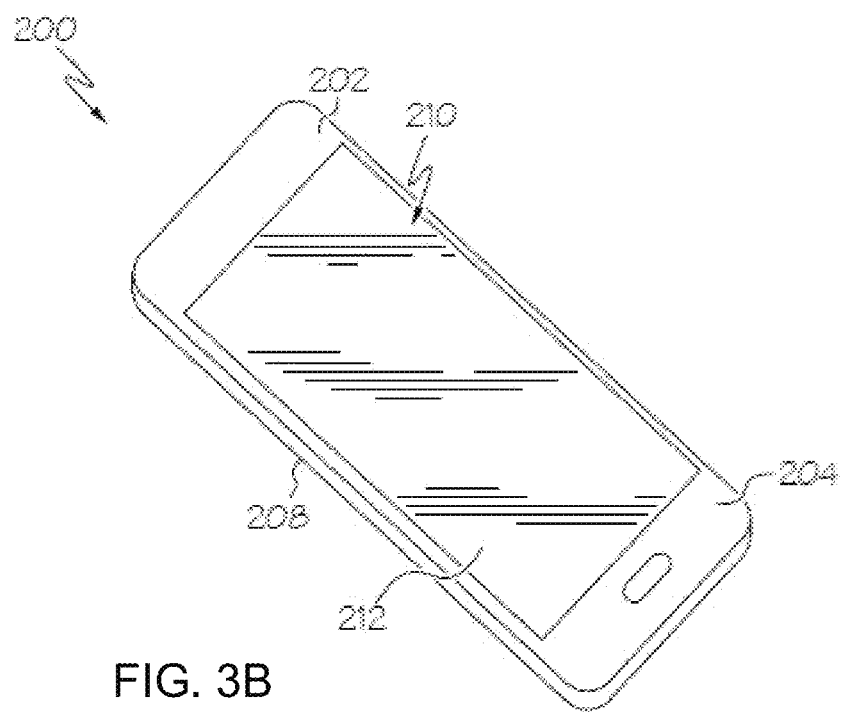
FIG. 3B is a perspective view of the exemplary electronic device of FIG. 3A.

The glass-based articles disclosed herein may be incorporated into another article such as an article with a display (or display articles) (e.g., consumer electronics, including mobile phones, tablets, computers, navigation systems, and the like), architectural articles, transportation articles (e.g., automobiles, trains, aircraft, sea craft, etc.), appliance articles, or any article that requires some transparency, scratch-resistance, abrasion resistance or a combination thereof. An exemplary article incorporating any of the glass articles disclosed herein is shown in FIGS. 3A and 3B. Specifically, FIGS. 3A and 3B show a consumer electronic device 200 including a housing 202 having front 204, back 206, and side surfaces 208; electrical components (not shown) that are at least partially inside or entirely within the housing and including at least a controller, a memory, and a display 210 at or adjacent to the front surface of the housing; and a cover 212 at or over the front surface of the housing such that it is over the display. In some embodiments, at least a portion of at least one of the cover 212 and/or the housing 202 may include any of the glass-based articles disclosed herein.

Examples

Various embodiments will be further clarified by the following examples. In the Examples, prior to being strengthened, the Examples are referred to as "substrates" or "glass-based substrates". After being subjected to strengthening, the Examples are referred to as "articles" or "glass-based articles".

Glass substrates according to Compositions A-D were ion exchanged and the resulting articles tested.

Composition A was substantially free of lithium and had the following composition: 57.43 mol % $SiO_2$, 16.10 mol % $Al_2O_3$, 17.05 mol % $Na_2O$, 2.81 mol % MgO, 0.003 mol % $TiO_2$, 6.54 mol % $P_2O_5$, and 0.07 mol % $SnO_2$. For Composition A, the Poisson ratio (v) was 0.22, and the Young's modulus (E) was about 68 GPa. The Young's modulus values and Poisson ratio values recited in this disclosure refer to a value as measured by a resonant ultrasonic spectroscopy technique of the general type set forth in ASTM E2001-13, titled "Standard Guide for Resonant Ultrasound Spectroscopy for Defect Detection in Both Metallic and Non-metallic Parts."

Composition B was substantially free of lithium and had the following composition: 58.54 mol % $SiO_2$, 15.30 mol % $Al_2O_3$, 16.51 mol % $Na_2O$, 2.28 mol % $K_2O$, 1.07 mol % MgO, 0.004 mol % $TiO_2$, 6.54 mol % $P_2O_5$, and 0.10 mol % $SnO_2$.

Composition C had the following composition: 64.12 mol % $SiO_2$, 0.29 mol % $B_2O_3$, 18.36 mol % $Al_2O_3$, 4.81 mol % $Na_2O$, 0.12 mol % $K_2O$, 12.05 mol % $Li_2O$, 0.19 mol % MgO, 0.03 mol % $Fe_2O_3$, and 0.07 mol % $SnO_2$.

Composition D had the following composition: 58.39 mol % $SiO_2$, 6.11 mol % $B_2O_3$, 17.83 mol % $Al_2O_3$, 1.73 mol % $Na_2O$, 0.18 mol % $K_2O$, 4.41 mol % MgO, 0.08 mol % $SnO_2$, 0.02 mol % $Fe_2O_3$, 0.58 mol % CaO, and 10.66 mol % $Li_2O$.

Composition E was a glass-ceramic, having the following composition by mol %: 72.35 mol % $SiO_2$, 4.34 mol % $Al_2O_3$, 0.06 mol % $Na_2O$, 0.06 mol % $K_2O$, 22.11 mol % $Li_2O$, 0.02 mol % $Fe_2O_3$, 0.86 mol % $P_2O_5$, 2.05 mol % $ZnO_2$, and 0.16 mol % $SnO_2$.

The stress profiles discussed herein were measured via the Refractive Near Field (RNF) method where the CT matches the measurements of CT provided by scattering polarimetry using a SCALP-5 made by Glasstress Co., Estonia. In addition, due to limitations of the RNF to provide accurate information in the first ~2 μm of the stress profile due to the size of the beam used in this measurement technique, the RNF data is extrapolated to the surface to find the stress at the surface so that it also matches the measurements done by the FSM-6000 LE from Orihara, Japan that measures the estimated stress at the surface. Therefore, the total stress profiles matches at the center of the sample the CT measured by the SCALP instrument and at the surface the CS measured by the FSM-6000 LE instrument providing an accurate representation of the whole stress profile from surface to the center of the sample. Depending on the thickness of the potassium layer in the surface different FSM wavelenths for the light source were used. For examples using Compositions C and D, a UV light source version of the FSM instrument was used leading to the appearance of 2 fringes in the spike region allowing for the proper metrology of the approximated surface CS. For examples using Compositions A and B, a direct extrapolation to the surface from the RNF data was used as there were too many fringes to make a proper measurement with the FSM instrument even when changing the wavelength to the near-infrared at 780 nm.

The second derivatives were computed by taking the forward finite difference of the first derivative of the stress profiles, as discussed previously.

Examples

Glass-based articles exhibiting frangible behavior were formed according to the summary of conditions provided in Table 1. The articles were 0.8 mm thick.

Figure 4:
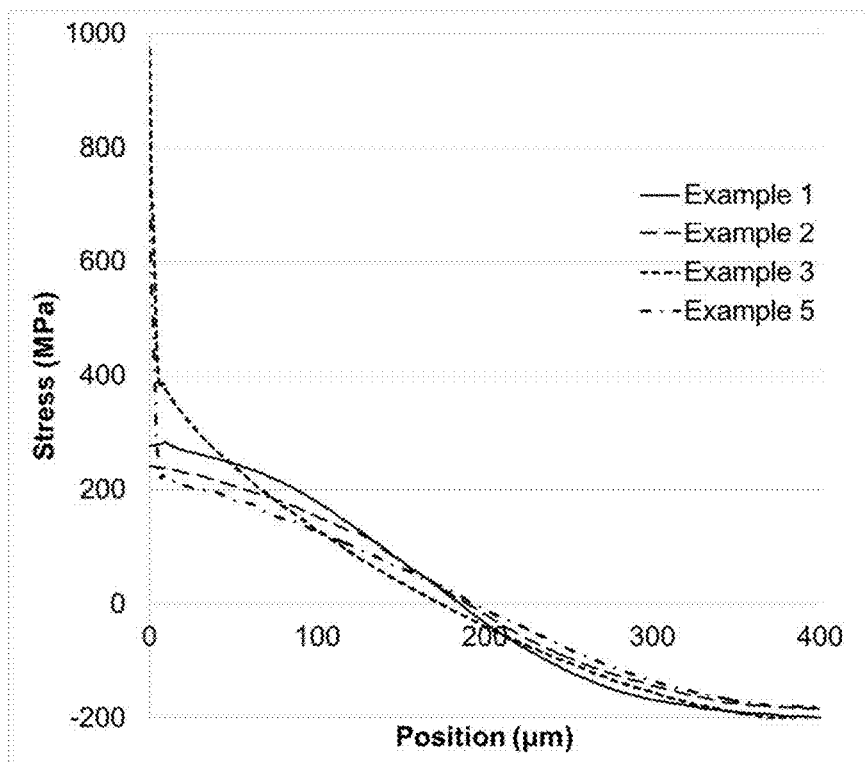
FIG. 4 is a plot of stress as a function of depth after ion exchange according to some embodiments.
Figure 5:
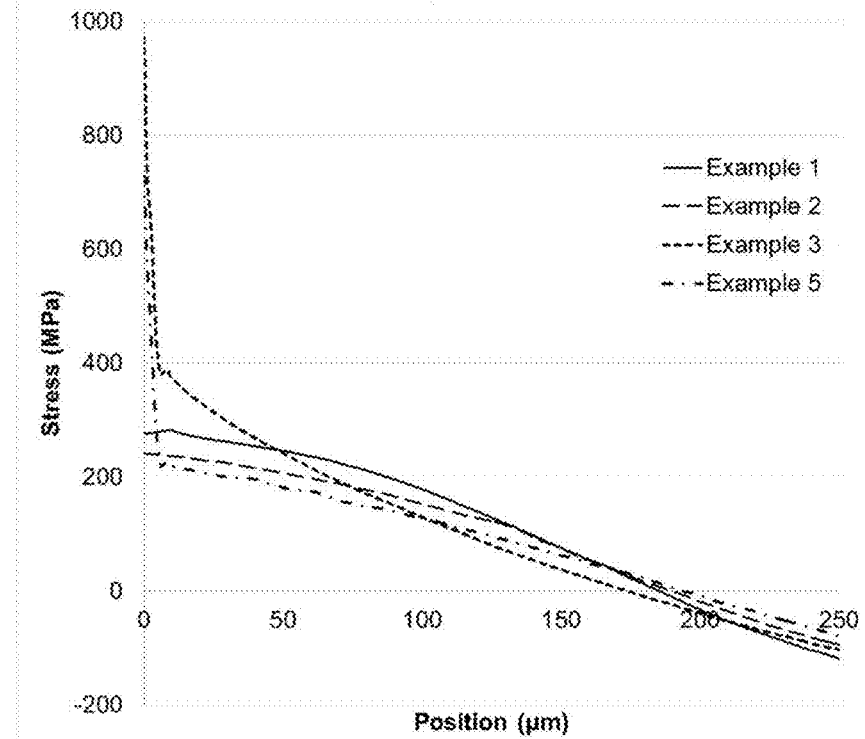
FIG. 5 is a plot of stress as a function of depth after ion exchange according to some embodiments.
Figure 6:
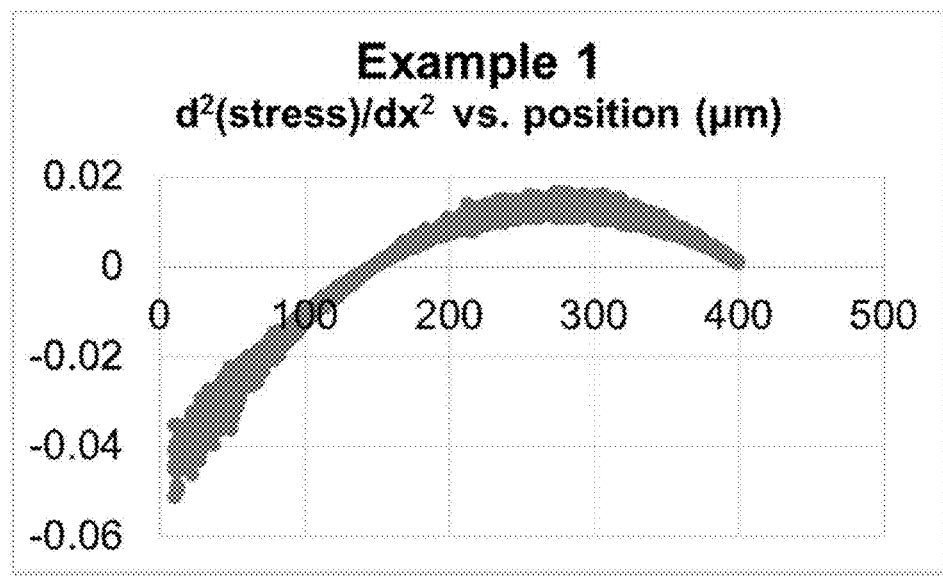
FIG. 6 is a plot of the second derivative of a stress profile of an embodiment.
Figure 7:
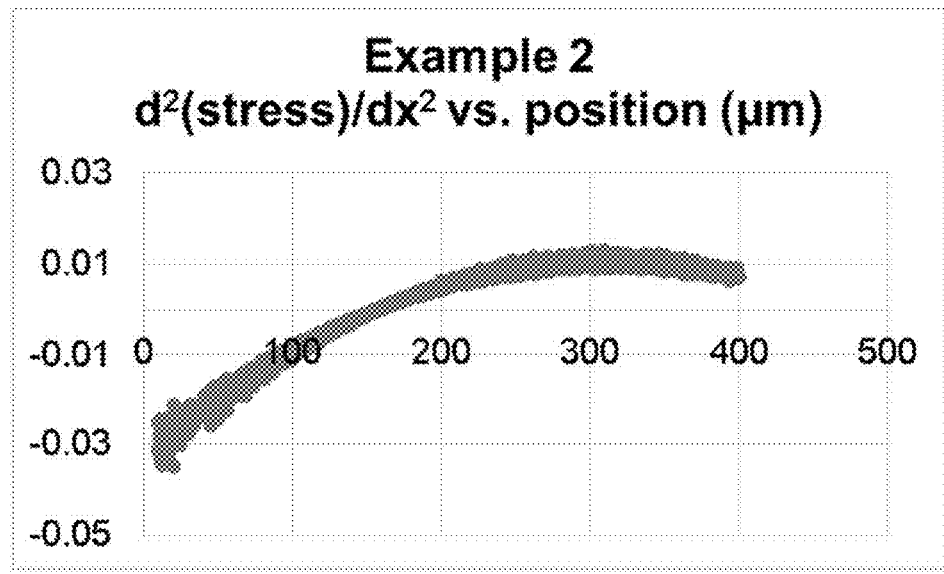
FIG. 7 is a plot of the second derivative of a stress profile of an embodiment.
Figure 8:
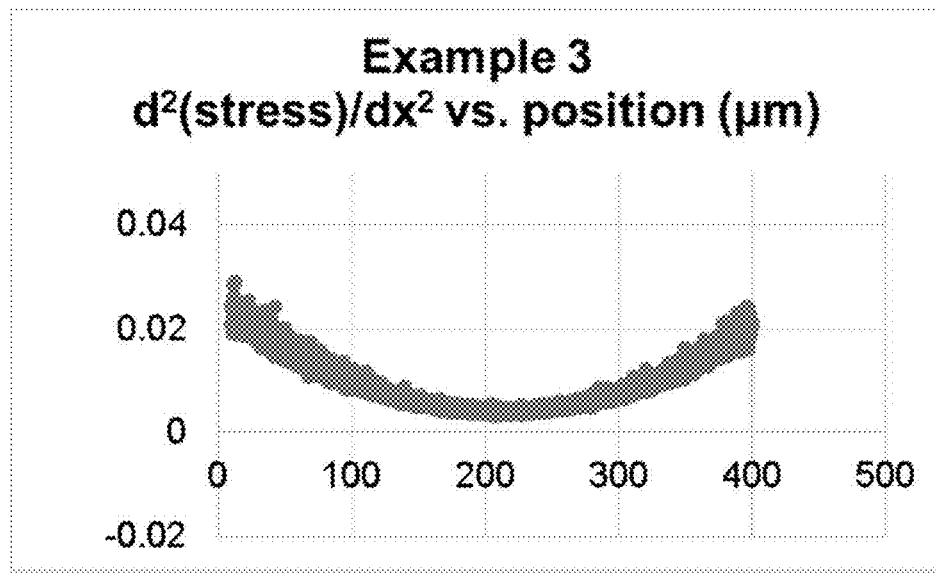
FIG. 8 is a plot of the second derivative of a stress profile of an embodiment.
Figure 9:
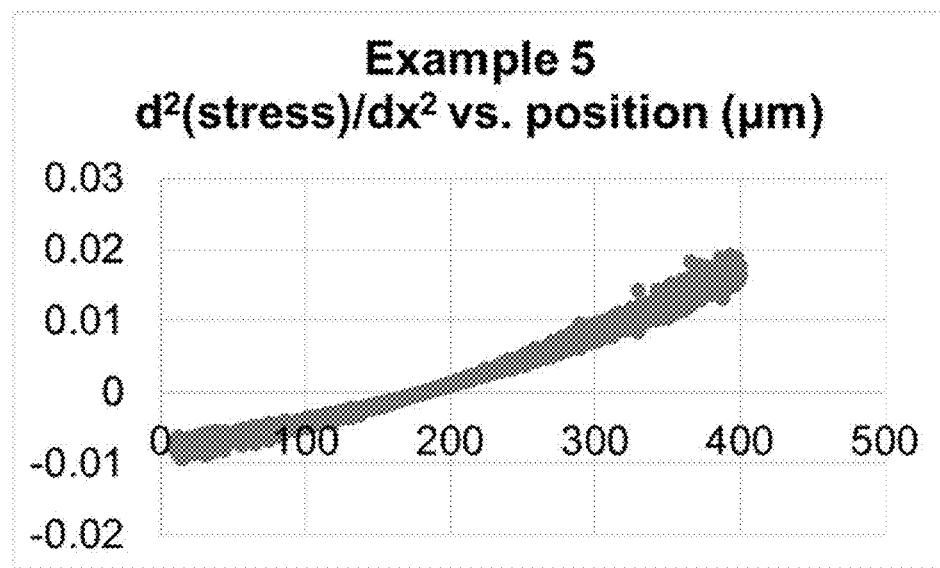
FIG. 9 is a plot of the second derivative of a stress profile of an embodiment.

Table 1 provides a summary of IOX conditions and resulting compressive stress (CS), compressive stress at a knee ($CS_k$), spike depth of layer ($DOL_{sp}$), central tension (CT), and depth of compression (DOC) for the examples. FIG. 4 is a plot of stress as a function of depth for one-half the thickness of the article after ion exchange for Examples 1, 2, 3, and 5 to a depth of 400 micrometers. FIG. 5 is the plot of FIG. 4 enlarged to show detail to a depth of 250 micrometers. The treatments were designed to achieve the maximum CT possible for a time processing span of <16 hours and also to enable metrology of the data with the previously mentioned techniques.

Examples 1 and 2 were produced with a single IOX treatment, and Examples 3 and 5 were produced with a double IOX treatment, creating a spike region.

TABLE 2

| Ex. | Presence of a negative curvature region | Second derivative FIG. # | Average Second derivative $d^2(stress)/dx^2$ from 40 μm to 144 μm[a] (MPa/μm$^2$) |
|---|---|---|---|
| 1 | Yes | 6 | −0.01456 |
| 2 | Yes | 7 | −0.01143 |
| 3 | No | 8 | 0.01123 |
| 5 | Yes | 9 | −0.00467 |

[a] 0.05·t to 0.187·t

FIGS. 4 and 5 show the measured stress profiles of Examples 1-3 and 5. Table 2 provides an interpretation and analysis of FIGS. 4, 5, and 6-9. FIGS. 6-9 show the second

TABLE 1

| Ex. | Composition | IOX | CS (MPa) | $CS_k$ (MPa) | $DOL_{sp}$ (μm) | CT (MPa) | DOC (μm) |
|---|---|---|---|---|---|---|---|
| 1 | A | SIOX 100 wt % K, 500° C., 16 hours | 277 | — | — | 202 | 185 μm 0.2317·t |
| 2 | B | SIOX 100 wt % K, 500° C., 9 hours | 241 | — | — | 182 | 190 μm 0.2377·t |
| 3 | C | DIOX 50 wt % K/50 wt % Na, 400° C., 4 hours 90 wt % K/10 wt % Na, 400° C., 0.5 hours | 973 | 463 | 3.9 | 205 | 174 μm 0.21757·t |
| 4 | C | DIOX 50 wt % K/50 wt % Na, 400° C., 4 hours 95 wt % K/5 wt % Na, 400° C., 0.5 hours | — | — | — | 195 | — |
| 5 | D | DIOX 50 wt % K/50 wt % Na, 450° C., 10 hours 90 wt % K/10 wt % Na, 450° C., 2 hours | 731 | 224 | 4.8 | 178 | 193 μm 0.2417·t |
| 6 | A | SIOX 100 wt % K, 500° C., 8 hours | — | — | — | 144 | — |
| 7 | A | SIOX 100 wt % K, 500° C., 12 hours | — | — | — | 175 | — |
| 8 | A | SIOX 100 wt % K, 500° C., 20 hours | — | — | — | 222 | — |
| 9 | A | SIOX 100 wt % K, 500° C., 24 hours | — | — | — | 237 | — |

For compositions C and D, either a dual-step ion exchange (DIOX) or a single-step ion exchange (SIOX) could be employed. However, in order to have a thicker spike with high CS at the surface, a DIOX was chosen for processing Examples 3-5. The treatment of Example 3 (DIOX, step 1 of 4 hrs and step 2 of 0.5 hours, 400° C.) led to very high CS (973 MPa) with a CT of 205 MPa and a DOC of 174 μm. This DOC is smaller than the DOC's for Examples 1, 2, and 5.

The treatment of Example 5 (DIOX, step 1 of 4 hrs and step 2 of 0.5 hours, 450° C.) led to a unique product: moderate CS (731 MPa) with a CT of 178 MPa and a DOC of 193 μm. Due at least in part to a very strong non-linearity of diffusion and stress relaxation, Example 5 exhibited a DOC of 0.241·t for a thickness of 800 μm. This DOC is deeper than those achieved in Examples 1 and 2, which were 185 μm (0.231·t) and 190 μm (0.237·t), respectively. Normally in linear diffusion processes, it can be demonstrated that the physical limit for a parabolic profile is approximately DOC ~0.217t. Therefore, Examples 1-3 and 5 demonstrate examples produced by a SIOX without a spike and a DIOX with a spike that match this limit, and in some cases greatly exceeds this limit, with a simultaneously large CT or energy stored in the tensile region.

derivative of the stress profiles for Examples 1-3 and 5, respectively. Examples 1-3 and 5 show a negative curvature region and negative average second derivatives from 40 μm to 144 μm, the absolute values of which ranges from 0.00467 to 0.01456.

For Example 3, which has a concave curvature and traditional parabolic shape, the second derivative after the spike was positive in the region after the spike and before the DOC, which can be demonstrated by an exemplary region of 0.05·t to 0.18·t. Due to nominal symmetry, it is expected that the same behavior would be found in the region of 0.82·t to 0.95·t. For Example 3, the second derivative ($d^2(stress)/dx^2>0$) is positive deep into the center of the glass in accordance with a parabolic-like profile.

For Examples 1-2 and 5, the stress profiles had a convex curvature after the spike and therefore the second derivative after the spike and before the DOC (e.g., 0.05·t to 0.18·t, and similarly due to symmetry 0.82·t to 0.95·t was negative. In some embodiments, after the DOC, the second derivative may change sign indicating a change in curvature.

In Table 3, Young's modulus E and Poisson ratio ν for Examples 1-3 and 5 are provided. Based on the stress profiles shown in FIGS. 4 and 5 and the information in Table 1, the following energy parameters for the compressive region were computed: $W_{el}^{tens}$, $W_{norm}^{tens}$, $WT_{norm}^{tens}$ for the tensile region and $W_{el}^{comp}$, $W_{norm}^{comp}$, $WT_{norm}^{comp}$ as described above.

TABLE 3

| Ex. | E (GPa) | ν (a.u.) | $W_{el}^{tens}$ (J/m$^2$) | $W_{norm}^{tens}$ (MPa$^2$m) | $WT_{norm}^{tens}$ (MPa$^2$m$^{05}$) | $W_{el}^{comp}$ (J/m$^2$) | $W_{norm}^{comp}$ (MPa$^2$m) | $WT_{norm}^{comp}$ (MPa$^2$m$^{05}$) |
|---|---|---|---|---|---|---|---|---|
| 1 | 65.0 | 0.215 | 119.36 | 9.88 | 349.42 | 163.23 | 13.51 | 477.86 |
| 2 | 65.0 | 0.220 | 92.75 | 7.72 | 273.27 | 121.02 | 10.08 | 356.57 |
| 3 | 84.3 | 0.220 | 86.57 | 9.35 | 330.82 | 145.87 | 15.76 | 557.39 |
| 5 | 83.2 | 0.236 | 63.99 | 6.96 | 246.37 | 79.84 | 8.69 | 307.43 |

Comparative Examples

Comparative glass-based articles exhibiting non-frangible behavior were formed according to the summary of conditions provided in Table 4. The articles were 0.8 mm thick.

Table 4 provides a summary of IOX conditions and resulting central tension (CT).

TABLE 4

| Comparative Ex. | Composition | IOX | CT (MPa) |
|---|---|---|---|
| A | D | SIOX 88 wt % K/12 wt % Na/2 wt % Li, 450° C., 8 hours | 110 |
| B | E | SIOX 100 wt % Na, 470° C., 16 hours | 121 |

Example 6—Testing

Fragmentation. The number of fragments that a glass can be broken into will depend directly on the tensile energy stored in the glass or glass-ceramic article. The center tension is a measurement of the tensile stress at the center of the glass and usually scales with the amount of total tensile energy in the article under test. Therefore the higher the energy stored or center tension the higher the number of fragments.

Figure 10:
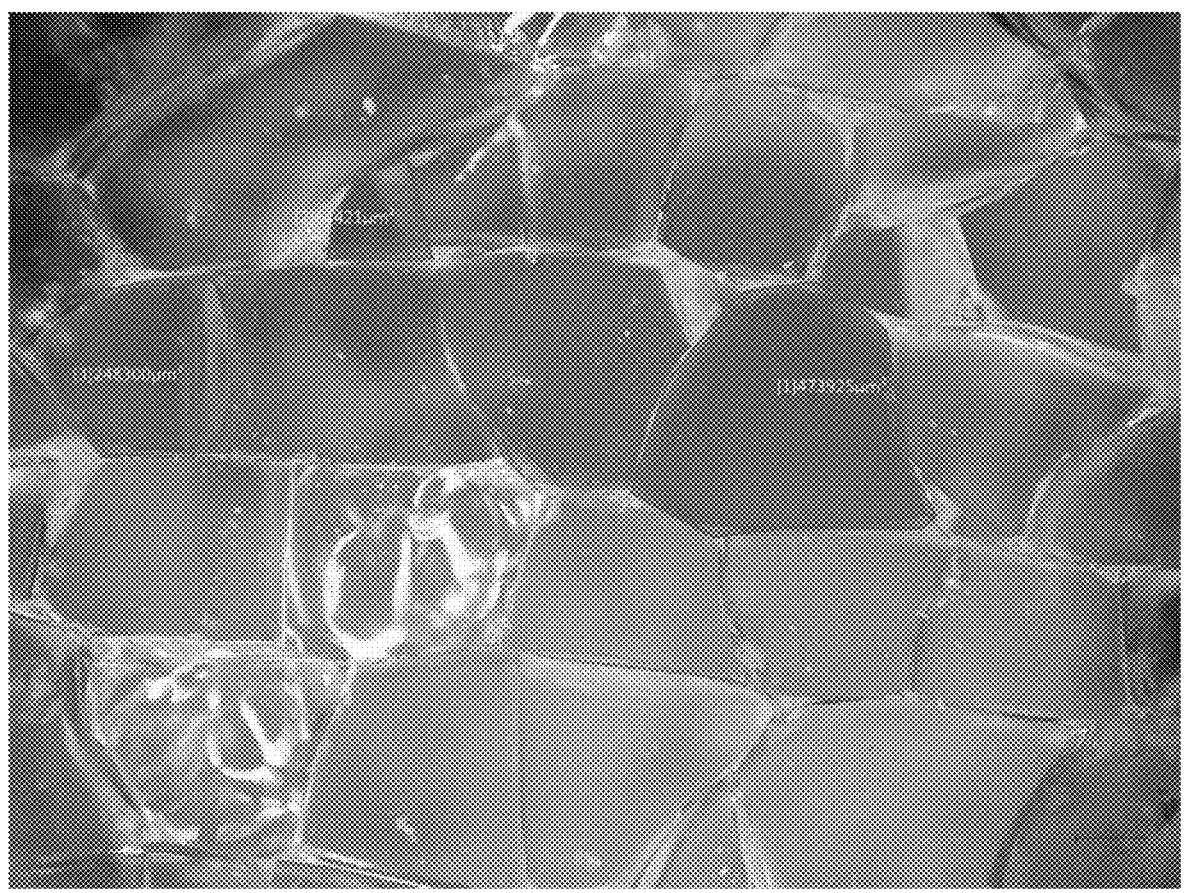
FIG. 10 is a micrograph of a fragmentation pattern of an embodiment herein.

FIG. 10 is a micrograph of a fragmentation pattern of Example 5 after indent in the center of the glass article (CT was 178 MPa for the 0.8 mm thick article). Three fragments are outlined and the area is indicated: [1] 473,925 μm$^2$; [2] 64,421 μm$^2$; and [3] 248,300 μm$^2$. The fragment areas varied widely in the range of 500,000 μm$^2$ to 50,000 μm$^2$. Measurements were performed with a VHX-5000 microscope from Keyence, USA. The number of fragments was therefore between 200 and 2000 fragments/cm$^2$. Assuming perfect square fragments where the size is x=sqrt(Area), such measurements would correspond to fragments of size between 0.07 mm to 0.007 mm. The fragment density can be controlled by the CT value, where lower CT values generate smaller fragment densities and higher CT values generate higher fragment densities.

Figure 11:
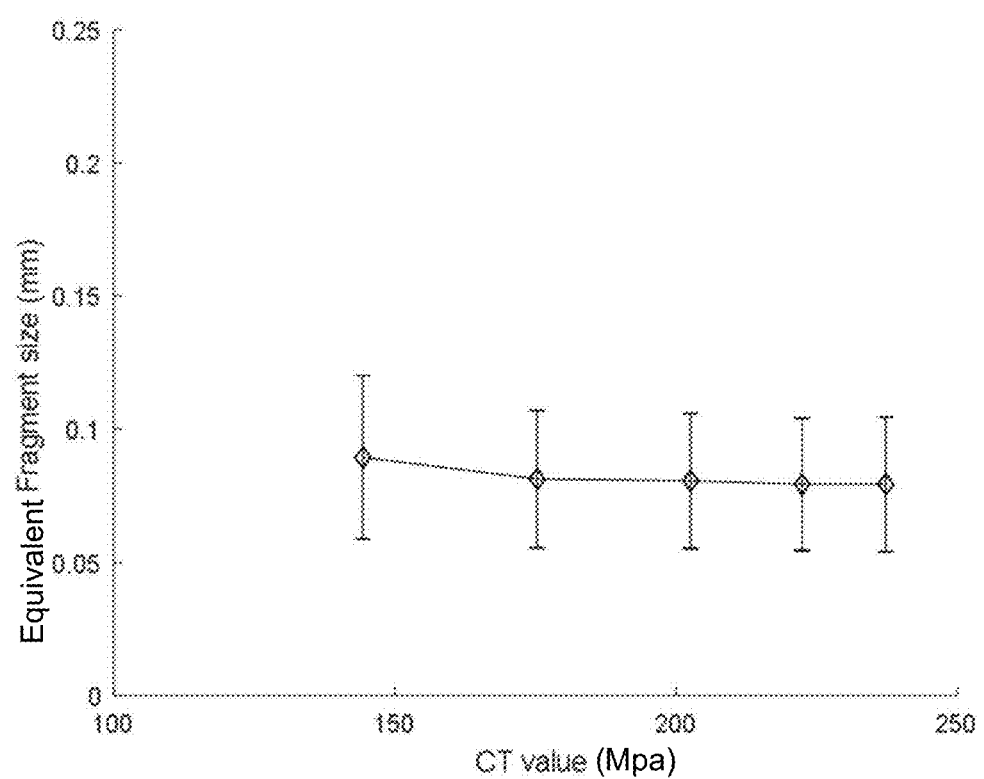
FIG. 11 is a plot of equivalent square fragment size (mm) versus CT value (MPa) for an embodiment.

FIG. 11 is a plot of equivalent square fragmentation size (mm) versus CT (MPa) for Examples 1 and 6-9, where equivalent square fragment size "x" is sqrt(Area), and the Area is the approximate area of the fragment as measured by the Keyence VHX 5000 microscope. Examples 1 and 6-9 were treated for varying times, which led to samples of several different CT levels for which its fragments were measured. The average and standard deviation of the equivalent square fragment size are in FIG. 11, and the standard deviation is relatively large. This is consequence of the variable size of the particles available after breakage. However, there is a trend where the fragment size decreases as the CT increases. However, due to the relatively large CTs in these highly frangible samples, the fragment sizes are quite small in size.

Drop Performance. Various exemplary and comparative glass-based articles were tested for drop performance. A controlled drop test, including multiple drops of glass, was performed using a phone-sized puck being dropped onto a 180 grit sand-paper (to simulate rough surfaces) or onto a 30 grit sand-paper. Drop tests were performed under ambient conditions (air, room temperature). The first drop was performed at a starting height of 20 cm, which represented the distance from the exposed surface of a glass-based article to the top of a drop surface. If no cover glass failure occurred on the 180 grit sand-paper, the drop height was increased by 10 cm, and the puck dropped again. The samples were then tested the same way against 30 grit sand-paper. The puck was sequentially dropped at 10 cm increments (e.g., 10 cm, then 20 cm, then 30 cm, etc.) until the glass-based article failed.

Figure 12:
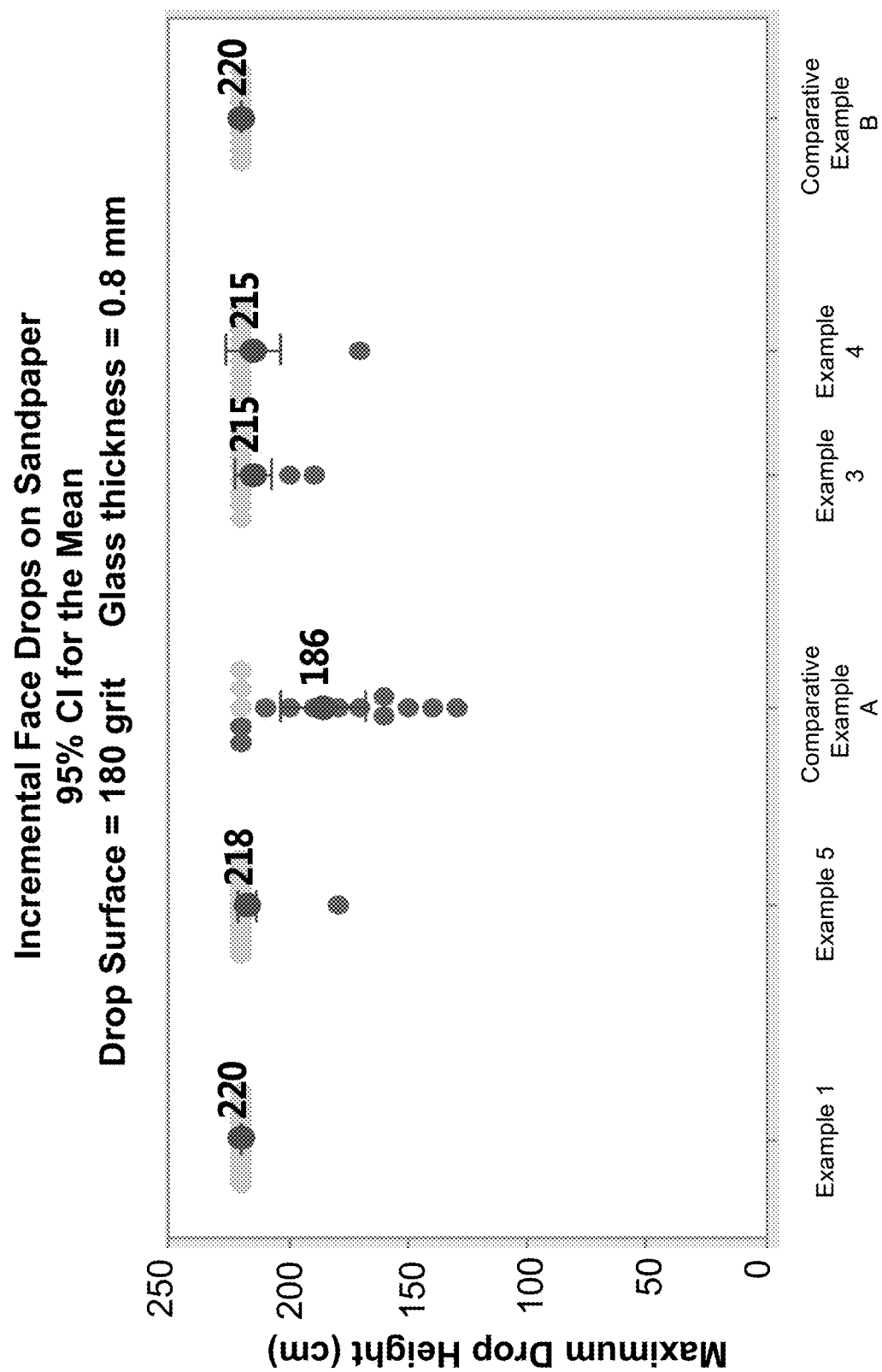
FIG. 12 is a plot of maximum drop height (cm) onto 180 grit for various glass-based article embodiments and comparative examples.
Figure 13:
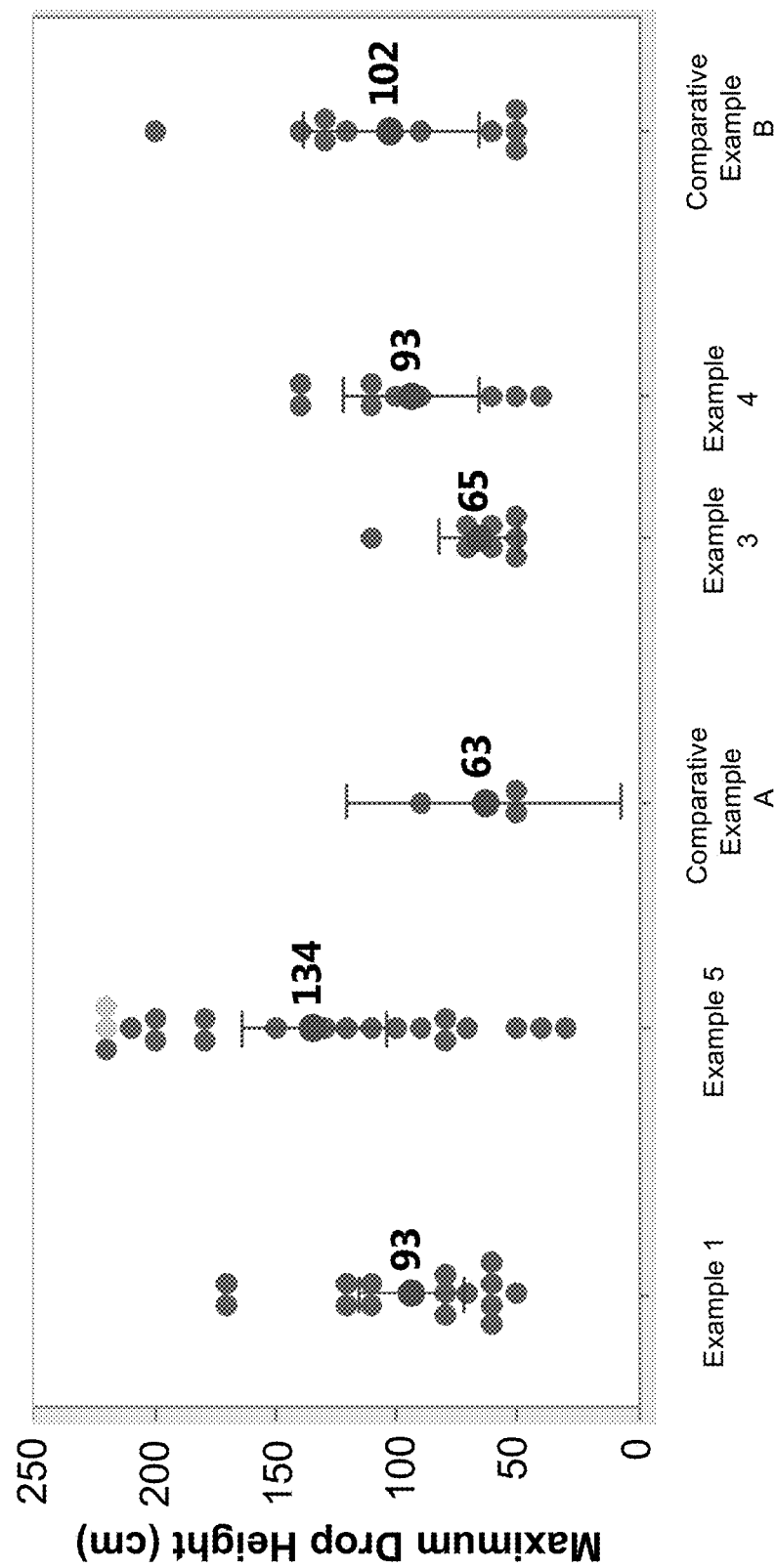
FIG. 13 is a plot of maximum drop height (cm) onto 30 grit for various glass-based article embodiments and comparative examples.

FIGS. 12 and 13 are plots of the results of the controlled-drop test for 180 grit and 30 grit, respectively, where the height where the glass-based article failure occurred is provided.

In FIG. 12 at 180 grit, performance of all frangible glass-based articles (Examples 1 and 3-5) and the glass-ceramic containing article (Comparative Example B) was significantly better than the non-frangible comparative glass article of Comparative Example A (Composition D) with the lowest CT of 110 MPa. The improved performance is due at least in part to the higher amount of energy stored in the exemplary glass-based articles. The glass-ceramic material (Comparative Example B), being a poly-crystalline material, behaves differently from the non-crystalline containing glass-based articles. Even with a moderate non-frangible level of CT of 121 MPa, Comparative Example B had performance comparable to glasses with higher CT that are frangible.

In FIG. 13 at 30 grit, the sand-paper is coarser relative to the 180 grit of FIG. 12, with the possibility to create defects at increased depths. Example 5, whose stress profile is shown in FIGS. 4 and 5, outperformed all of the frangible glass-based articles. This is despite having a relatively lower CT value than the other conditions being compared. Without intending to be bound by theory, the likely reason for this performance is the non-linear behavior of the ion-exchange in this material that leads to a stress profile that among other features has a DOC of greater than 0.21·t as demonstrated in FIGS. 4 and 5 and Table 1, with a DOC of 193 μm (0.241·t) for a glass thickness of 800 μm. For Example 5, a tensile energy ($W_{el}^{tens}$) of 63.99 J/m$_2$ for a Young's modulus of 83.2 GPa and a Poisson ratio ν of 0.236. This also corresponds to normalized tensile energy ($W_{norm}^{tens}$) of 6.96 MPa$^2$m, which if renormalized by the square root of thickness for a sample with t=0.8 mm, as $W_{norm}^{tens}$ is 246.37 MPa$^2$m$^{0.5}$.

Example 3 has a smaller DOC of 174 μm (0.2175·t) for a glass thickness of 800 μm relative to Example 5, but this DOC is still greater than 0.21·t. Example 3 had a tensile energy ($W_{el}^{tens}$) of 86.57 J/m², a Young's modulus of 84.3 GPa, and a Poisson ratio ν of 0.220. This also corresponds to normalized tensile energy ($W_{norm}^{tens}$) of 9.35 MPa²m, which if renormalized by the square root of thickness for a sample with t=0.8 mm, the $WT_{norm}^{tens}$ is 330.82 MPa·m$^{0.5}$. Therefore, even with higher energy stored in comparison with Example 5, due to the lower DOC, the probability of survival decreased in the drop test for a coarse 30-grit sand paper as target.

While the foregoing is directed to various embodiments, other and further embodiments of the disclosure may be devised without departing from the basic scope thereof, and the scope thereof is determined by the claims that follow.

What is claimed is:

1. A glass-based article comprising:
 opposing first and second surfaces defining a thickness (t) in millimeters (mm); and
 a stress profile comprising:
  a maximum compressive stress ($CS_{max}$) greater than or equal to 150 MPa;
  a depth of compression (DOC) that is greater than or equal to 0.21t; and
  a peak central tension (CT) in a tensile region that is greater than:
  (E/68 GPa)*75 MPa*1 mm$^{0.5}$/√(t),
  where E is a Young's modulus value of a glass-based substrate having the same composition and structure as a center of the glass-based article,
  wherein the stress profile further comprises a negative curvature region, wherein a second derivative of stress as a function of depth is negative,
  wherein the CT is in the range of greater than or equal to 110 MPa and less than or equal to 220 MPa.

2. The glass-based article of claim 1, wherein the CT is in the range of greater than or equal to 120 MPa and less than or equal to 220 MPa.

3. The glass-based article of claim 1, wherein the t is in the range of greater than or equal to 0.02 millimeters and less than or equal to 2 millimeters.

4. The glass-based article of claim 1, wherein a maximum absolute value of an average of the second derivative in the range of 0.05t to 0.18t is greater than or equal to 0.0001 MPa/μm².

5. The glass-based article of claim 1, wherein the stress profile further comprises:
 a spike region extending from the first surface to a knee;
 a tail region extending from the knee to a center of the glass-based article;
 wherein the spike region comprises the maximum compressive stress, the maximum compressive stress is greater than or equal to 500 MPa, and a compressive stress at the knee ($CS_k$) is greater than or equal to 100 MPa.

6. The glass-based article of claim 1, wherein the DOC is located at a depth of greater than or equal to 100 micrometers.

7. The glass-based article of claim 1, wherein the $CS_{max}$ is greater than or equal to 400 MPa.

8. The glass-based article of claim 1, wherein upon breakage of the glass-based article and formation of fragments, a density of fragments is greater than or equal to 12.9 fragments/cm².

9. The glass-based article of claim 1, upon breakage of the glass-based article and formation of fragments, an equivalent square size of the fragments is greater than or equal to 3 mm.

10. The glass-based article of claim 1, wherein an elastic energy ($W_{el}^{tens}$) stored in a tensile region is greater than or equal to 20 J/m² and/or less than or equal to 200 J/m².

11. A consumer electronic product comprising:
 a housing having a front surface, a back surface, and side surfaces;
 electrical components provided at least partially within the housing, the electrical components including at least a controller, a memory, and a display, the display being provided at or adjacent the front surface of the housing; and
 a cover disposed over the display;
 wherein at least a portion of at least one of the housing and the cover comprises the glass-based article of claim 1.

12. A glass-based article comprising:
 a opposing first and second surfaces defining a thickness (t) that is in the range of greater than or equal to 0.02 millimeters to less than or equal to 2 millimeters; and
 a stress profile comprising:
  a maximum compressive stress ($CS_{max}$) greater than or equal to 150 MPa;
  a depth of compression (DOC) that is greater than or equal to 0.21t;
  a normalized tensile energy ($WT_{norm}^{tens}$) stored in a tensile region of the glass-based article is greater than or equal to 60 MPa²·m$^{0.5}$; and
  a peak central tension (CT) in a tensile region that is greater than:
  (E/68 GPa)*75 MPa*1 mm$^{0.5}$/√(t),
  where E is a Young's modulus value of a glass-based substrate having the same composition and structure as a center of the glass-based article,
  wherein the stress profile further comprises a negative curvature region, wherein a second derivative of stress as a function of depth is negative,
  wherein the CT is in the range of greater than or equal to 110 MPa and less than or equal to 220 MPa.

13. A glass-based article comprising:
 opposing first and second surfaces defining a thickness (t) that is in the range of greater than or equal to 0.4 millimeters to less than or equal to 0.8 millimeters; and
 a stress profile comprising:
  a maximum compressive stress ($CS_{max}$) greater than or equal to 150 MPa;
  a depth of compression (DOC) that is greater than or equal to 0.21t;
  a peak central tension (CT) in a tensile region that is greater than or equal to 110 MPa to less than or equal to 220 MPa; and
  the peak central tension (CT) in the tensile region that is greater than:
  (E/68 GPa)*75 MPa*1 mm$^{0.5}$/√(t),
  where E is a Young's modulus value of a glass-based substrate having the same composition and structure as a center of the glass-based article,
  wherein the stress profile further comprises a negative curvature region, wherein a second derivative of stress as a function of depth is negative.

14. A glass-based article comprising:
 a lithium aluminosilicate composition;
 opposing first and second surfaces defining a thickness (t) that is in the range of greater than or equal to 0.4 millimeters to less than or equal to 0.8 millimeters; and
 a stress profile comprising:
  a maximum compressive stress ($CS_{max}$) greater than or equal to 500 MPa;

a spike region extending from the first surface to a knee having a knee compressive stress ($CS_k$) of greater than or equal to 200 MPa;

a tail region extending from the knee to a center of the glass-based article;

a depth of compression (DOC) that is greater than or equal to 0.21t;

a peak central tension (CT) in a tensile region that is greater than or equal to 110 MPa to less than or equal to 220 MPa; and the peak central tension (CT) in the tensile region that is greater than:

(E/68 GPa)*75 MPa*1 mm$^{0.5}$/√(t), where E is a Young's modulus value of a glass-based substrate having the same composition and structure as a center of the glass-based article, wherein the stress profile further comprises a negative curvature region, wherein a second derivative of stress as a function of depth is negative.

15. The glass-based article of claim 14, wherein a maximum absolute value of an average of the second derivative in the range of 0.05t to 0.18t is greater than or equal to 0.0001 MPa/μm$^2$.

16. The glass-based article of claim 14, wherein an elastic energy ($W_{el}^{tens}$) stored in a tensile region is greater than or equal to 20 J/m$^3$ and/or less than or equal to 200 J/m$^2$.

17. A method of manufacturing a glass-based article comprising:

exposing a glass-based substrate having opposing first and second surfaces defining a substrate thickness (t) to an ion exchange salt bath for a duration of less than or equal to 16 hours at a bath temperature of greater than or equal to 400° C. and less than or equal to 500° C. such that the glass-based article comprises a stress profile comprising:

a maximum compressive stress ($CS_{max}$) greater than or equal to 150 MPa;

a depth of compression (DOC) that is greater than or equal to 0.21t;

a peak central tension (CT) that is greater than or equal to 400-110 MPa and less than or equal to 220 MPa; and the peak central tension (CT) in the tensile region that is greater than:

(E/68 GPa)*75 MPa*1 mm$^{0.5}$/√(t), where E is a Young's modulus value of a glass-based substrate having the same composition and structure as a center of the glass-based article, wherein the stress profile further comprises a negative curvature region, wherein a second derivative of stress as a function of depth is negative.

18. A process for making a glass-based article based in part on mechanical modeling, the glass-based article comprising a peak central tension (CT) in a tensile region, the process comprising:

exposing a glass-based substrate comprising opposing first and second surfaces defining a substrate thickness (t) in millimeters (mm) to an ion exchange treatment to form the glass-based article;

generating a stress profile in the glass-based article comprising:

a maximum compressive stress ($CS_{max}$) greater than or equal to 150 MPa; and a depth of compression (DOC) that is greater than or equal to 0.21t;

wherein the peak central tension (CT) in the tensile region that is greater than:

(E/68 GPa)*75 MPa*1 mm$^{0.5}$/√(t), where E is Young's modulus value of the glass-based substrate having the same composition and structure as a center of the glass-based article, wherein the stress profile further comprises a negative curvature region, wherein a second derivative of stress as a function of depth is negative, wherein the CT is in the range of greater than or equal to 110 MPa and less than or equal to 220 MPa.

* * * * *

UNITED STATES PATENT AND TRADEMARK OFFICE
CERTIFICATE OF CORRECTION

PATENT NO. : 11,912,614 B2
APPLICATION NO. : 17/084766
DATED : February 27, 2024
INVENTOR(S) : Schneider It is certified that error appears in the above-identified patent and that said Letters Patent is hereby corrected as shown below:

On the Title Page

On page 2, Other Publications, Line 2, delete "Ceramic Materials Department" and insert -- Fracture Mechanics of Ceramics, vol. 14 --.

In the Claims

In Column 28, Line 2, in Claim 17, delete "400- 110," and insert -- 110 --.

Signed and Sealed this
Twenty-fifth Day of June, 2024

Katherine Kelly Vidal
*Director of the United States Patent and Trademark Office*